(12) United States Patent
Nagata

(10) Patent No.: US 8,020,130 B2
(45) Date of Patent: Sep. 13, 2011

(54) TIMING ANALYSIS APPARATUS AND METHOD FOR SEMICONDUCTOR INTEGRATED CIRCUIT IN CONSIDERATION OF POWER SUPPLY AND GROUND NOISES

(75) Inventor: Makoto Nagata, Kobe (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 407 days.

(21) Appl. No.: 12/254,295

(22) Filed: Oct. 20, 2008

(65) Prior Publication Data

US 2009/0106720 A1 Apr. 23, 2009

(30) Foreign Application Priority Data

Oct. 19, 2007 (JP) .............................. P2007-272720

(51) Int. Cl.
*G06F 17/50* (2006.01)
(52) U.S. Cl. ........ 716/115; 716/110; 716/111; 716/112; 716/113; 716/114; 716/132; 716/133; 716/134; 716/138; 702/85; 702/89; 702/108; 702/112; 333/110; 333/111; 370/201; 370/436
(58) Field of Classification Search .......... 716/110–115, 716/132–134, 138; 702/85, 89, 108–112; 333/110–111; 370/201, 436, 516–519
See application file for complete search history.

(56) References Cited

U.S. PATENT DOCUMENTS

| | | | | |
|---|---|---|---|---|
| 4,358,741 A | * | 11/1982 | Nardin | 331/2 |
| 6,687,881 B2 | * | 2/2004 | Gauthier et al. | 716/113 |
| 7,019,576 B1 | * | 3/2006 | Sancheti et al. | 327/261 |
| 7,039,536 B2 | | 5/2006 | Nagata et al. | |
| 2007/0226659 A1 | * | 9/2007 | Suaya et al. | 716/1 |

FOREIGN PATENT DOCUMENTS

JP 3569681 B2 6/2004

OTHER PUBLICATIONS

Shimazaki et al, "An Integrated Timing and Dy7namic Supply Noise Verification for Nano-meter CMOS SoC Designs", IEEE 2005 Custom Integrated Circuits Conference, Sep. 2005, pp. 31-34.
Fukazawa et al, "Measurements of Digital Signal Delay Variation Due to Dynamic Power Supply Noise" Proceedings of IEEE Asian Solid-State Circuits Conference 2005 (A-SSCC 2005), $6-6, Nov. 2005, pp. 165-168.
Fukazawa et al, "Delay Variation Analysis in Consideration of Dynamic Power Supply Noise Waveform", Proceedings of IEEE 2006 Custom Integrated Circuits Conference (CICC 2006), Sep. 2006, pp. 865,868.

* cited by examiner

*Primary Examiner* — Nghia M Doan
(74) *Attorney, Agent, or Firm* — Nixon & Vanderhye P.C.

(57) ABSTRACT

In a timing analysis apparatus for use in a semiconductor integrated circuit, which analyzes operation timing of a semiconductor integrated circuit having a logic gate circuit including a plurality of logic gates, a controller detects at least one of a power supply voltage and a ground voltage of a power supply, decomposes the noise waveform into frequency components, classifies the frequency components into low-frequency components lower than a predetermined threshold frequency and high-frequency components higher than the threshold frequency, calculates a static delay time of each of the logic gates due to the low-frequency components, calculates a dynamic delay time of each of the logic gates due to the high-frequency components, and determines a delay time of each of the logic gates by synthesizing the calculated respective delay times.

18 Claims, 20 Drawing Sheets

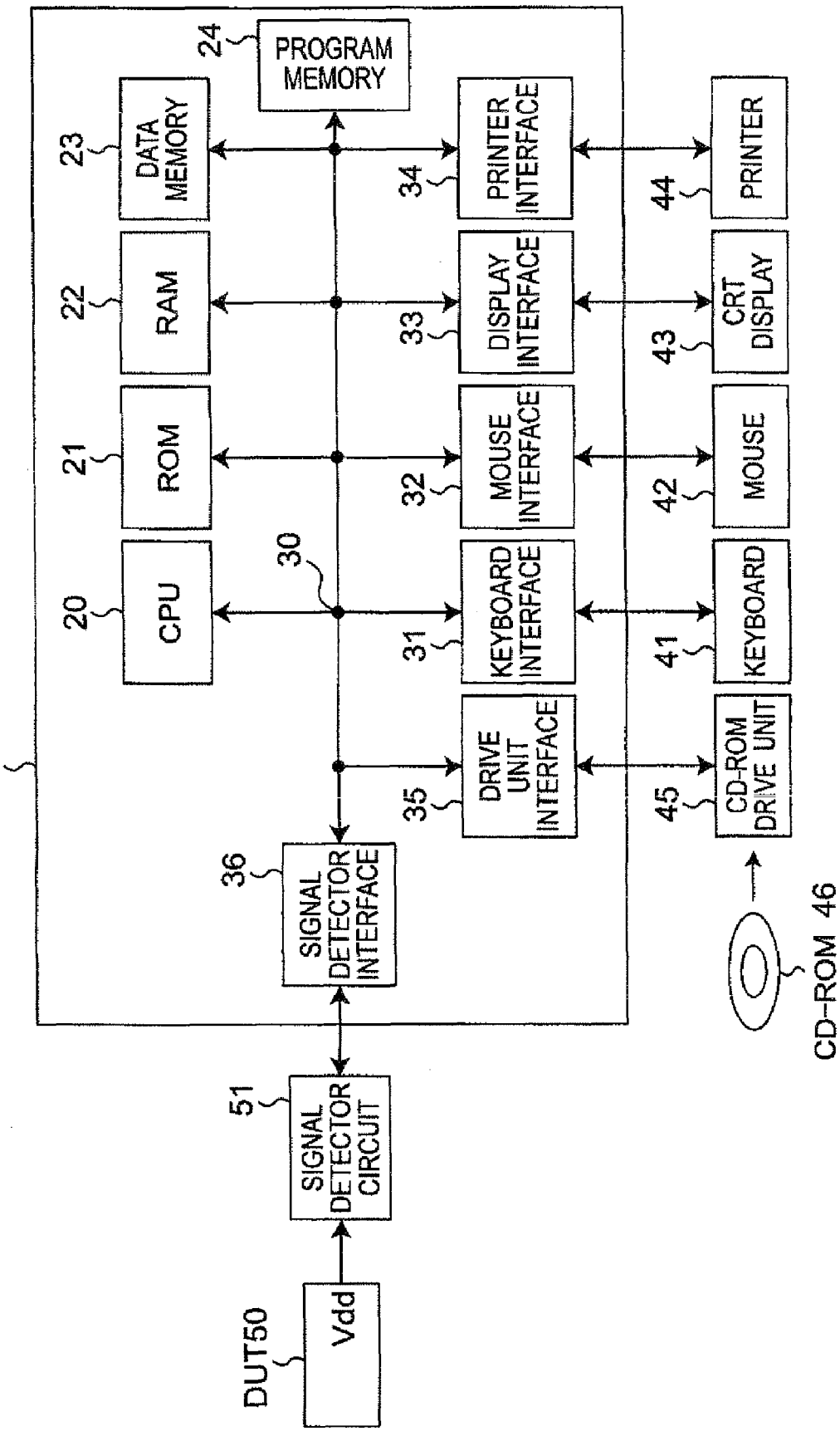

*Fig.2A* *Fig.2B*
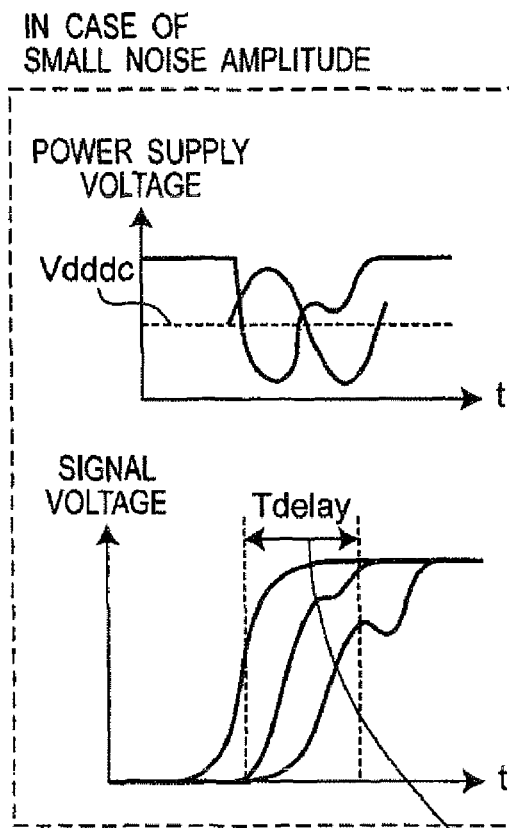
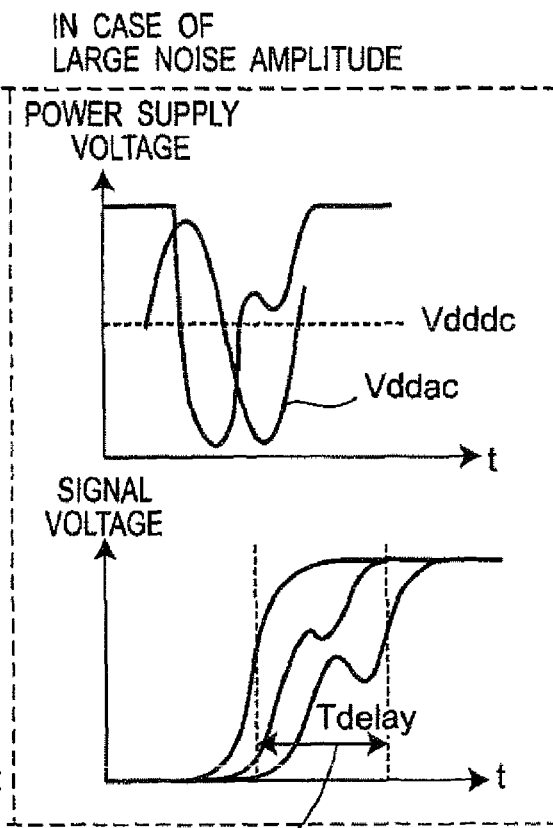
*Fig.2C*
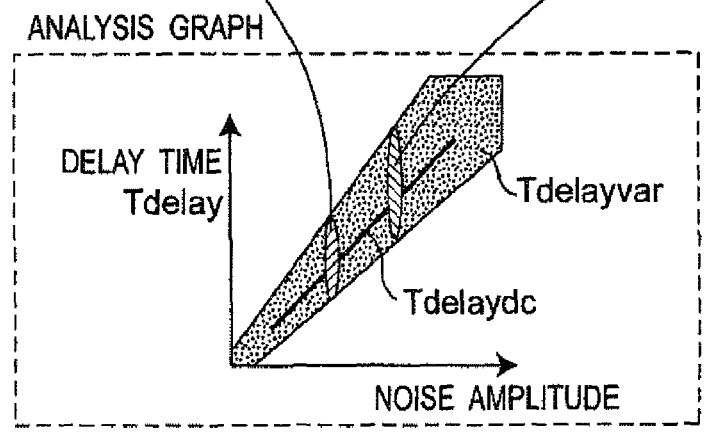

VOLTAGES OF DC COMPONENT ($F_{dc}$)

|   | $V_0$ | $V_1$ | $V_2$ | $V_3$ | $V_4$ | ... |
|---|---|---|---|---|---|---|
| $L_0$ | | | | | | |
| $L_1$ | | | | | | |
| $L_2$ | | | GATE DELAY TIME $T_{delaydc}(F_{dc})$ | | | |
| $L_3$ | | | | | | |
| $L_4$ | | | | | | |
| ⋮ | | | | | | |

LOAD CONDITIONS (OUTPUT LOAD IMPEDANCE, SLOPE OF INPUT SIGNAL, ETC.)

SIGNAL VOLTAGE $V_0$
$V_1$
$T_{delaydc}$

VOLTAGE AMPLITUDES Vac (VPP) OF
AC COMPONENTS ($F_{ac}$) OF POWER SUPPLY NOISE

| EACH $F_{ac}$ | $Vac_1$ | $Vac_2$ | $Vac_3$ | $Vac_4$ | $Vac_5$ | ... |
|---|---|---|---|---|---|---|
| $L_0$ | | | | | | |
| $L_1$ | | | | | | |
| $L_2$ | | DELAY TIME FLUCTUATION COMPONENTS MINIMUM : Tdelaymin ($F_{ac}$) MAXIMUM : Tdelaymax ($F_{ac}$) | | | | |
| $L_3$ | | | | | | |
| $L_4$ | | | | | | |
| ⋮ | | | | | | |

LOAD CONDITIONS (OUTPUT LOAD IMPEDANCE, SLOPE OF INPUT SIGNAL, ETC.)

Fig.19

| AMOUNT OF CORRECTION OF DELAY TIME | FLUCTUATION RATIO Rvdc FROM REFERENCE POWER SUPPLY VOLTAGE | | | | | |
|---|---|---|---|---|---|---|
| | -0.1 | -0.05 | 0.0 | 0.05 | 0.1 | |
| 1.0 | 12.3 | 5.61 | 0.0 | -4.69 | -8.68 | |
| 2.0 | --- | --- | --- | --- | --- | |
| 4.0 | 12.5 | 5.62 | 0.0 | -4.75 | -8.71 | |
| 6.0 | --- | --- | --- | --- | --- | |
| 8.0 | 12.6 | 5.66 | 0.0 | -4.73 | -8.75 | |
| | --- | --- | --- | --- | --- | |

LOAD CAPACITANCE RATIO Rload (F.O.)

Fig.20

| Fac(MHz) | Vac₁ | Vac₂ | Vac₃ | Vac₄ | Vac₅ |
|---|---|---|---|---|---|
| L₀ | | | | | |
| L₁ | | | | | |
| L₂ | | | | | |
| L₃ | | | | | |
| L₄ | | | | | |

AC COMPONENT VOLTAGES Vac (Vpp)

LOAD CONDITIONS (OUTPUT LOAD IMPEDANCE, SLOPE OF INPUT SIGNAL, ETC.)

DELAY TIME FLUCTUATION COMPONENTS
MINIMUM : Tdelaymin (Fac)
MAXIMUM : Tdelaymax (Fac)

*Fig.22*

AMOUNT OF CORRECTION OF DELAY TIME

RATIOS Rvac OF AC COMPONENT AMPLITUDE RELATIVE TO REFERENCE POWER SUPPLY VOLTAGE VALUE LOAD CAPACITANCE RATIO Rload (F.O.)

|  | 0.0 | 0.05 | 0.10 | 0.15 | 0.20 |
|---|---|---|---|---|---|
| 1.0 | 0.0<br>0.0 | -5.88<br>6.25 | -11.5<br>13.0 | -16.9<br>20.2 | -22.1<br>28.1 |
| 2.0 | --- | --- | --- | --- | --- |
| 4.0 | 0.0<br>0.0 | -5.59<br>6.09 | -10.7<br>12.7 | -15.5<br>20.0 | -20.0<br>28.0 |
| 6.0 | --- | --- | --- | --- | --- |
| 8.0 | 0.0<br>0.0 | -5.63<br>6.22 | -10.8<br>13.1 | -15.6<br>20.7 | -20.0<br>29.1 |
|  | --- | --- | --- | --- | --- |

TIMING ANALYSIS APPARATUS AND METHOD FOR SEMICONDUCTOR INTEGRATED CIRCUIT IN CONSIDERATION OF POWER SUPPLY AND GROUND NOISES

BACKGROUND OF THE INVENTION

1. Field of the Invention

The present invention relates to a timing analysis apparatus and method for use in semiconductor integrated circuits and, in particular, to a timing analysis apparatus and method for calculating the delay time of logic gates in a semiconductor large-scale digital integrated circuit (LSI) in consideration of fluctuations in power supply and ground voltages of LSI, i.e., influences of power supply and ground noises.

2. Description of the Related Art

In accordance with developments in the semiconductor manufacturing process, a large amount of logic gate circuit employing submicron transistors are integrated at high density in a digital LSI. Fluctuations in the voltage of the power wiring and ground wiring generated in the operation of such a digital LSI, i.e., the power supply noises are actualized by a reduction in the power supply voltage caused by the scale shrinkage and becomes unignorable. The effective power supply voltage value and the ground voltage value applied to the logic gates during the switching operation needs to be taken into consideration for the calculation of the delay time of the logic gate.

Handling of the power supply noises by the conventional timing analysis method can be considered by being separated into its DC component (IR drop) and temporal fluctuation components (dynamic drop). The former is the DC component of a voltage drop obtained by multiplying an average power current value of a digital LSI by the resistance component of an internal power net and a ground net. In this case, the average power current value can be obtained by, for example, integrating the power current of the entire test vector duration given to a digital LSI and averaging the resultant by the test vector duration.

Moreover, in order to express a voltage fluctuation distribution in the plane of a large-scale digital LSI, it is also performed to obtain the distribution of the effective voltage value by dividing a digital LSI into a mesh or blocks and obtaining the average current value in every small region. In this case, the delay time of logic gates is assumed to fluctuate in proportion to the effective voltage value and calculated as an amount of change from the delay time in the nominal voltage value. On the other hand, the latter includes a technique to statically approximate the dynamic noise every short time interval by averaging a voltage fluctuation value within the operation time of the logic gates (See, for example, Non-Patent Document 1). Updating of the delay time of the logic gate is similar to that of the former. Prior art documents related to the present invention are as follows:

Patent Document 1: U.S. Pat. No. 3,569,681;
Non-Patent Document 1: K. Shimazaki, et al., "An Integrated Timing and Dynamic Supply Noise Verification for Nanometer CMOS SoC Designs", Proceedings of IEEE 2005 Custom Integrated Circuits Conference (CICC 2005), pp. 31-34, September 2005;
Non-Patent Document 2: M. Fukazawa et al., "Measurements of Digital Signal Delay Variation Due to Dynamic Power Supply Noise", Proceedings of IEEE Asian Solid-State Circuits Conference 2005 (A-SSCC 2005), #6-6, pp. 165-168, November 2005; and
Non-Patent Document 3: M. Fukazawa et al., "Delay Variation Analysis in Consideration of Dynamic Power Supply Noise Waveform", Proceedings of IEEE 2006 Custom Integrated Circuits Conference (CICC 2006), pp. 865-868, September 2006.

It has been known that the voltage fluctuations of the actual power supply and the ground, i.e., noises contain frequency components in a wide band ranging from low-frequency components including a direct current, and ranging to the clock frequency and its higher harmonics of the LSI. In a manner similar to that of the prior art described above, fluctuations in a cycle sufficiently longer than the switching operation time of the logic gates can be approximated as constant power and ground voltages operative on the logic gate.

However, the fluctuation components in a cycle equivalent to or shorter than the switching operation time (i.e., high frequency) are operative as dynamic changes in the effective power supply and ground voltages in the process of the switching operation of the logic gate, and a current change due to this fluctuates the delay time. In this case, the delay time of the logic gates is influenced by a time difference between the timing of the switching operation and the timing of the noise in the time window of gate switching, and this cannot be analyzed by the conventional technique (See, for example, Non-Patent Documents 2 and 3 and FIG. 3).

As described above, the conventional timing analysis method, which does not include the calculation of the delay time in consideration of the temporal fluctuations of the power supply noise and the ground noise, has therefore been unable to obtain sufficient analysis accuracy.

SUMMARY OF THE INVENTION

An object of the present invention is to solve the above problem and provide a timing analysis apparatus for use in semiconductor integrated circuit and method capable of determining the delay time of the logic gates in consideration of fluctuations in the static and dynamic power supply and ground voltage in a semiconductor integrated circuit such as a digital LSI, i.e., in consideration of the influence of noises.

In order to achieve the aforementioned objective, according to one aspect of the present invention, there is provided a timing analysis apparatus for use in a semiconductor integrated circuit. The analysis apparatus analyzing operation timing of a semiconductor integrated circuit having a logic gate circuit including a plurality of logic gates, and include a controller. The controller detects at least one of a power supply voltage and a ground voltage of a power supply, decomposes the noise waveform into frequency components, classifies the frequency components into low-frequency components lower than a predetermined threshold frequency and high-frequency components higher than the threshold frequency, calculates a static delay time of each of the logic gates due to the low-frequency components, calculates a dynamic delay time of each of the logic gates due to the high-frequency components, and determines a delay time of each of the logic gates by synthesizing the calculated respective delay times.

In the above-mentioned timing analysis apparatus, the controller further performs circuit design of the semiconductor integrated circuit by adjusting an output timing of each of the logic gates so as to fall within a predetermined time interval based on the determined delay time of each of the logic gates.

In addition, in the above-mentioned timing analysis apparatus, the controller preparatorily forms a first table representing relations between load conditions and voltages of the low-frequency components for a delay time due to the low-frequency components in the semiconductor integrated circuit, stores the table into a first storage device, and calculates the static delay time with reference to the first table.

Furthers in the above-mentioned timing analysis apparatus, the controller preparatorily forms a second table representing relations among load conditions, voltage amplitudes of the high-frequency components and a frequency of the power supply voltage for fluctuation components of delay time due to the high-frequency components in the semiconductor integrated circuit, stores the table into a second storage device, and calculates the dynamic delay time with reference to the second table.

Still further, in the above-mentioned timing analysis apparatus, the controller calculates a dynamic delay time of each of the logic gates due to a high-frequency component that has a maximum voltage amplitude among the high-frequency components.

In the above-mentioned timing analysis apparatus, the controller calculates a dynamic delay time of each of the logic gates due to a high-frequency component that has a clock frequency of the semiconductor integrated circuit among the high-frequency components.

In addition, in the above-mentioned timing analysis apparatus, the controller calculates a dynamic delay time of each of the logic gates due to a high-frequency component that has a clock frequency of the semiconductor integrated circuit and a double frequency of the clock frequency among the high-frequency components.

Further, in the above-mentioned timing analysis apparatus, the controller detects at least one of the power supply voltage and the ground voltage of the power supply by an actual measurement of the semiconductor integrated circuit.

Still further, in the above-mentioned timing analysis apparatus, the controller detects at least one of the power supply voltage and the ground voltage of the power supply by performing a circuit simulation of the semiconductor integrated circuit.

According to another aspect of the present invention, there is provided a timing analysis method for use in a semiconductor integrated circuit. The timing analysis method is provided for analyzing operation timing of a semiconductor integrated circuit having a logic gate circuit including a plurality of logic gates, and includes a control step. The control step includes steps of detecting at least one of a power supply voltage and a ground voltage of a power supply, decomposing the noise waveform into frequency components, classifying the frequency components into low-frequency components lower than a predetermined threshold frequency and high-frequency components higher than the threshold frequency, calculating a static delay time of each of the logic gates due to the low-frequency components, calculating a dynamic delay time of each of the logic gates due to the high-frequency components, and determining a delay time of each of the logic gates by synthesizing the calculated respective delay times.

In the above-mentioned timing analysis method, the control step further performs circuit design of the semiconductor integrated circuit by adjusting an output timing of each of the logic gates so as to fall within a predetermined time interval based on the determined delay time of each of the logic gates.

In addition, in the above-mentioned timing analysis method, the control step preparatorily forms a first table representing relations between load conditions and voltages of the low-frequency components for a delay time due to the low-frequency components in the semiconductor integrated circuit, stores the table into a first storage device, and calculates the static delay time with reference to the first table.

Further, in the above-mentioned timing analysis method, the control step preparatorily forms a second table representing relations among load conditions, voltage amplitudes of the high-frequency components and a frequency of the power supply voltage for fluctuation components of delay time due to the high-frequency components in the semiconductor integrated circuit, stores the table into a second storage device, and calculates the dynamic delay time with reference to the second table.

Still further, in the above-mentioned timing analysis method, the control step calculates a dynamic delay time of each of the logic gates due to a high-frequency component that has a maximum voltage amplitude among the high-frequency components.

In the above-mentioned timing analysis method, the control step calculates a dynamic delay time of each of the logic gates due to a high-frequency component that has a clock frequency of the semiconductor integrated circuit among the high-frequency components.

In addition, in the above-mentioned timing analysis method, the control step calculates a dynamic delay time of each of the logic gates due to a high-frequency component that has a clock frequency of the semiconductor integrated circuit and a double frequency of the clock frequency among the high-frequency components.

Further, in the above-mentioned timing analysis method, the control step detects at least one of the power supply voltage and the ground voltage of the power supply by an actual measurement of the semiconductor integrated circuit.

Still further, in the above-mentioned timing analysis method, the control step detects at least one of the power supply voltage and the ground voltage of the power supply by performing a circuit simulation of the semiconductor integrated circuit.

Therefore, according to the timing analysis apparatus for use in semiconductor integrated circuit and method of the present invention, the delay value of the logic gates, that constitutes the semiconductor integrated circuit such as a digital LSI can be calculated in consideration of the static and dynamic power supply noises. In addition, by handling the action of the relative relation between the noise waveform and the logic gate operation on the time base or the temporal axis as the fluctuation width of the delay time, and performing calculation of the delay time in the semiconductor integrated circuit dividedly at each frequency, the accuracy is increased. Further, the calculation step of the delay time is largely simplified to execute these steps by the ability of the existent computer, and therefore, highly accurate timing design can be achieved in a short time.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 1 is a block diagram showing a configuration of a timing analysis apparatus for use in semiconductor integrated circuit according to one embodiment of the present invention;

FIG. 2A is a waveform chart showing waveforms of a power supply voltage and a signal voltage when the noise amplitude of the semiconductor integrated circuit is small;

FIG. 2B is a waveform chart showing waveforms of the power supply voltage and the signal voltage when the noise amplitude of the semiconductor integrated circuit is large;

FIG. 2C is an analysis graph showing a delay time with respect to the noise amplitude according to the present performed embodiment;

FIG. 19 is one example of a table that shows the amount of correction of the delay time with respect to a fluctuation ratio Rvdc and a load capacitance ratio Rload (F.O.) from the reference power supply voltage of the DC component in the processing of the delay time fluctuation analysis according to the second implemental example in a numerical case of the processing of the delay time fluctuation analysis;

FIG. 20 is a table showing one example of a table that shows a delay time fluctuation components to the load conditions of an output load impedance, the slope of an input signal and so on and an AC component voltage Vac (Vpp) at each AC component frequency Fac (MHz) in the processing of the delay time fluctuation analysis according to a third implemental example in a numerical case of the processing of the delay time fluctuation analysis;

FIG. 22 is a table showing one example of a table that shows the amount of correction of the delay time relative to the reference power supply voltage, with the ratios Rvac (%) of the AC component amplitude and the load capacitance ratio Rload (F.O.) in the numerical case of FIG. 20.

DETAILED DESCRIPTION OF THE PREFERRED EMBODIMENTS

Figure 3A:
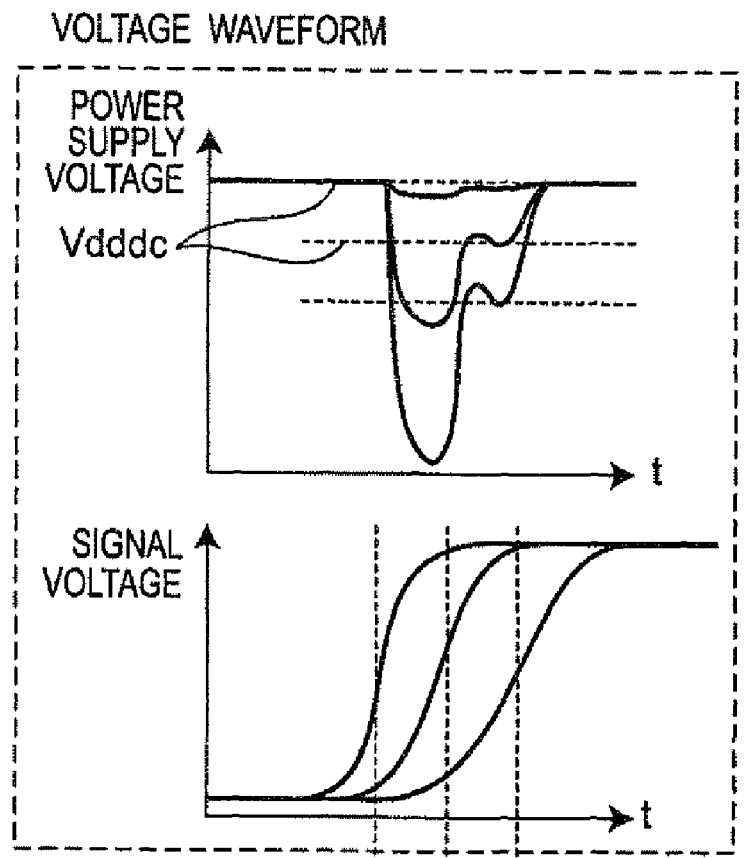
FIG. 3A is a waveform chart showing waveforms of the power supply voltage and the signal voltage of the semiconductor integrated circuit.

Preferred embodiments of the present invention will be described below with reference to the drawings. In each of the following preferred embodiments, like components are denoted by like reference numerals.

FIG. 1 is a block diagram showing a configuration of a timing analysis apparatus for use in semiconductor integrated circuit according to one preferred embodiment of the present invention. As shown in FIG. 1, the timing analysis apparatus for use in semiconductor integrated circuit according to the present preferred embodiment is configured so as to include a timing analysis controller 10 of the semiconductor integrated circuit of a digital computer. By executing calculation and processing of the delay time of the logic gates in the timing analysis in consideration of the dynamic power supply noise of FIG. 6, calculation and processing of the delay time of the logic gates in a digital circuit design in consideration of the dynamic power supply noise of FIG. 7 or the digital circuit design processing of FIG. 16, the timing analysis apparatus is characterized by detecting a power supply voltage Vdd of a device under test (hereinafter referred to as a DUT) 50 that is a semiconductor LSI circuit including a logic gate circuit configured by including, for example, a plurality of logic gates, analyzing its noise, determining the operation timing of the logic gate circuit based on the analysis results and performing timing analysis and designing of the logic gate circuit and designing of the digital circuit.

Figure 6:
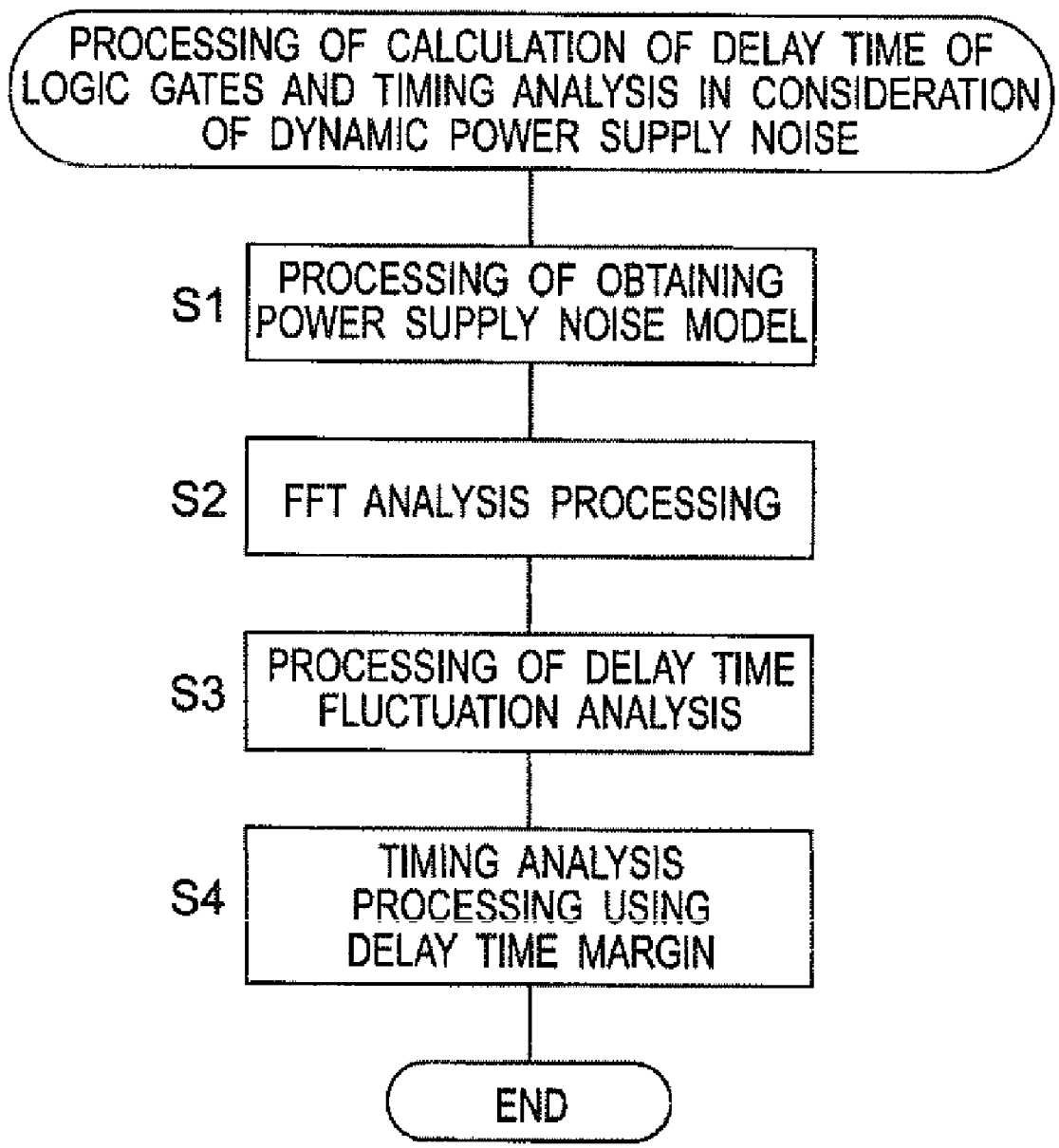
FIG. 6 is a flow chart showing a general outline of an example processing of calculation of delay time of logic gates and timing analysis in consideration of a dynamic power supply noise according to the present preferred embodiment.
Figure 7:
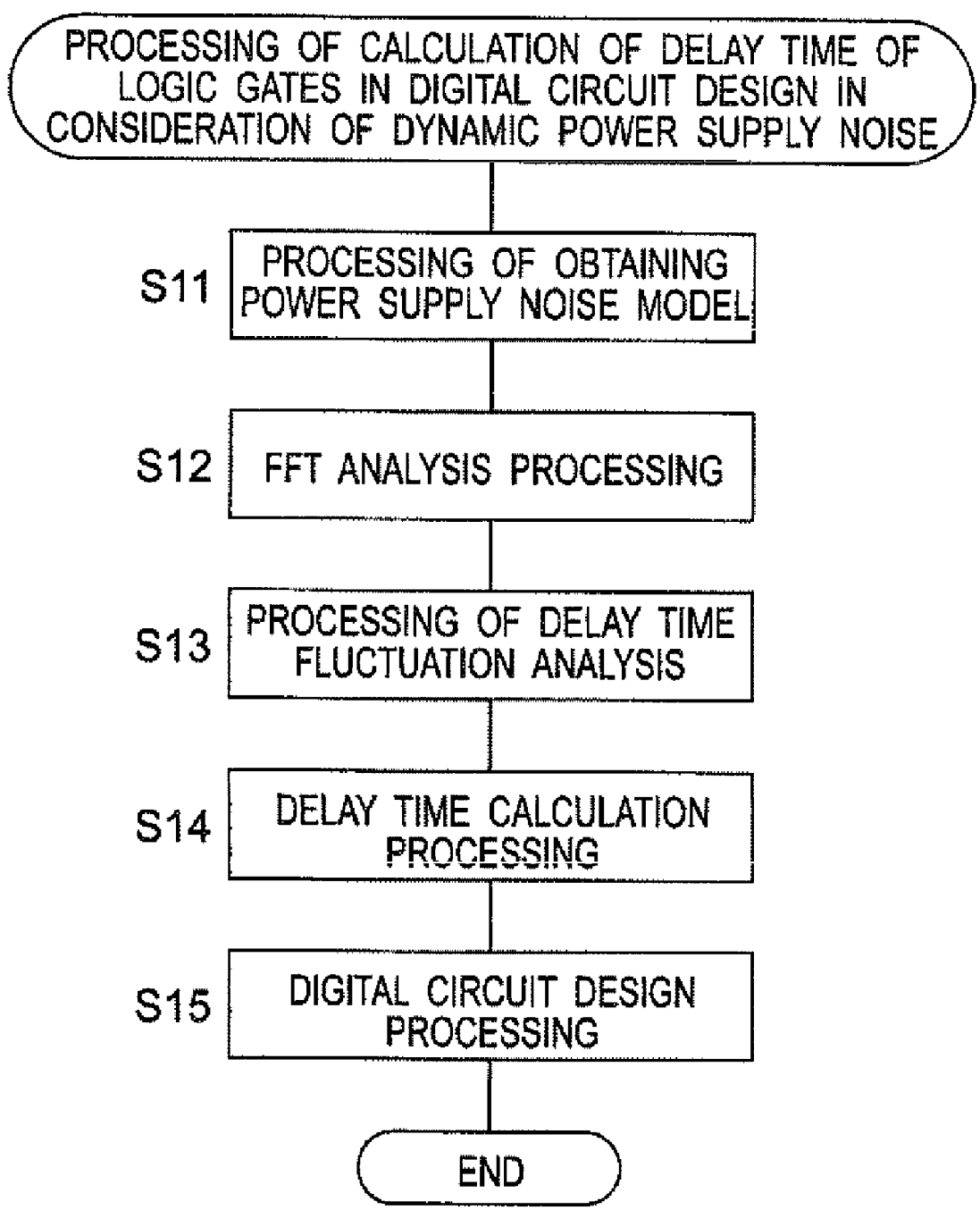
FIG. 7 is a flow chart showing an example processing of calculation of delay time of logic gates in a digital circuit design in consideration of the dynamic power supply noise according to the present preferred embodiment.
Figure 8:
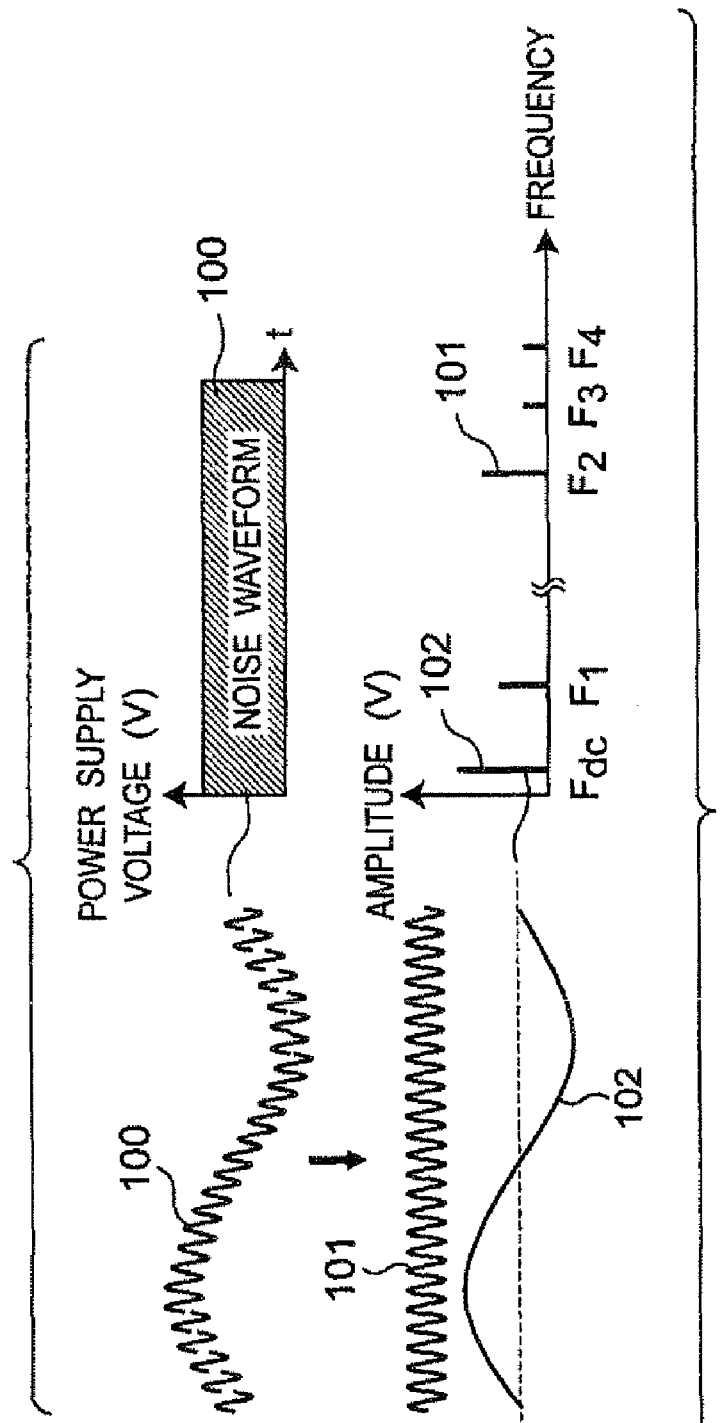
FIG. 8A is a view showing an example analysis processing of the power supply noise according to the present preferred embodiment.
FIG. 8B is a view showing an analysis processing of the power supply noise according to the present preferred embodiment.
Figure 16:
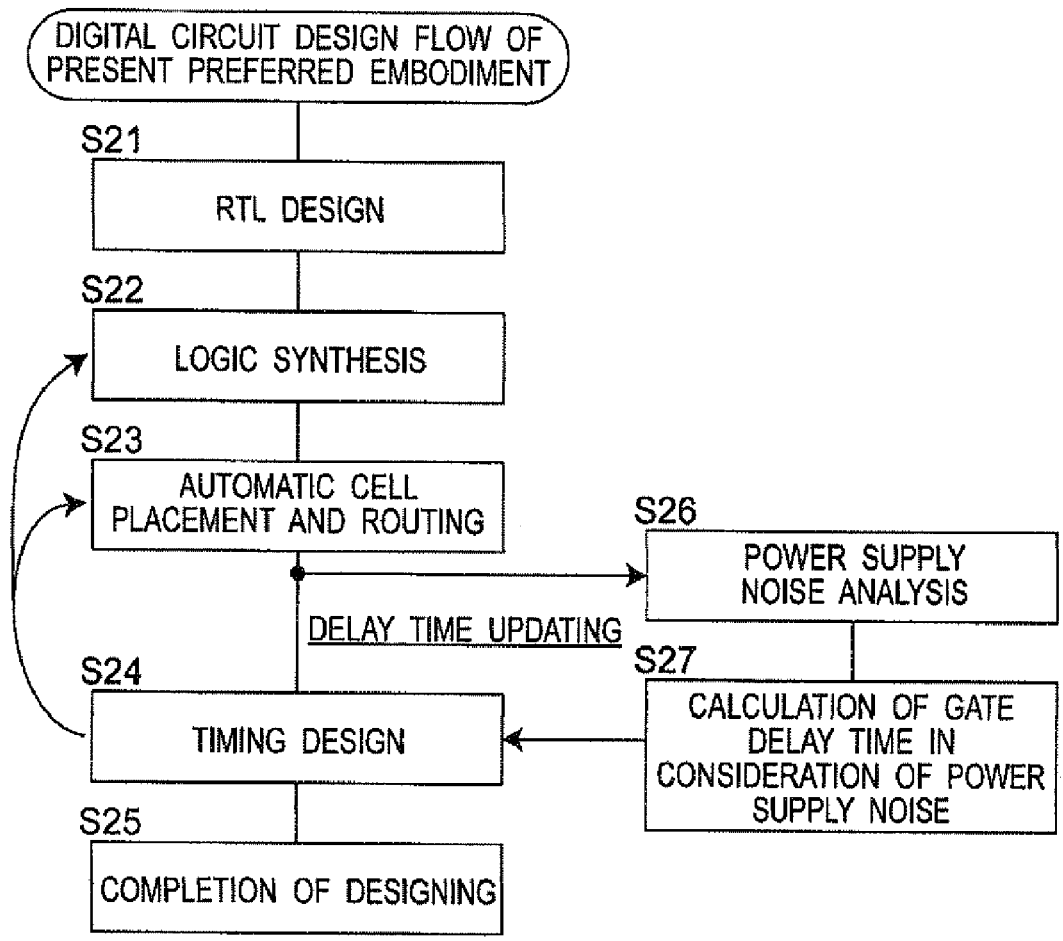
FIG. 16 is a flow chart showing an example digital circuit design flow according to the present preferred embodiment.

Referring to FIG. 1, the timing analysis controller 10 of the semiconductor integrated circuit includes:

(a) a CPU (Central Processing Unit) 20 of a computer that performs computing and control of the operation and the processing of the timing analysis controller 10 of the semiconductor integrated circuit;

(b) a ROM (Read-Only Memory) 21 that stores a fundamental program such as an operation program and data necessary for executing the same programs;

(c) a RAM (Random Access Memory) 22 that operates as a working memory of the CPU 20 and temporarily stores parameters and data necessary for the processing of the calculation and the processing of the delay time in the timing analysis of the logic gates in consideration of the dynamic power supply noise of FIG. 6, the calculation and the processing of the delay time of the logic gates in the digital circuit design in consideration of the dynamic power supply noise of FIG. 7, and the digital circuit design processing of FIG. 16;

(d) a data memory 23 that is configured by including, for example, a hard disk memory and stores data such as data of input parameters, data of simulation results and so on;

(e) a program memory 24 that is configured by including, for example, a hard disk memory and stores the processing program of FIGS. 6, 7 and 16 read out by using a CD-ROM drive unit 45;

(f) a keyboard interface 31 that is connected to a keyboard 41 for inputting predetermined data and instruction commands, receives the data and the instruction commands inputted from the keyboard 41, performs an interface processing of predetermined signal conversion and so on and transmits the resultant to the CPU 20;

(g) a mouse interface 32 that is connected to a mouse 42 for inputting an instruction command on a CRT display 43, receives the data and instruction commands inputted from the mouse 42, performs an interface processing of predetermined signal conversion and so on and transmits the resultant to the CPU 20;

(h) a display interface 33 that is connected to the CRT display 43 that displays data processed by the CPU 20, setting instruction screen and so on, converts the image data to be displayed into an image signal for the CRT display 43, outputs the signal to the CRT display 43 to display the same images;

(i) a printer interface 34 that is connected to a printer 44 that prints the data processed by the CPU 20, predetermined analysis results, design results and so on, performs predetermined signal conversion of the print data to be printed and so on, and outputs the resultant to the printer 44 to print the same;

(j) a drive unit interface 35 that is connected to the CD-ROM drive unit 45 for reading out the program data of the processing program from a CD-ROM 46 in which the processing program of FIGS. 6, 7 and 16 are stored, performs predetermined signal conversion of the program data of the reading-out processing program and transfers the resultant to the program memory 24; and (k) a signal detector interface 36 that receives a voltage signal obtained by detecting a power supply voltage Vdd of the DUT 50 via a predetermined power supply node by a signal detection circuit 51, performs A/D conversion of the signal to a predetermined signal format and outputs the resultant to the CPU 20.

In this case, these circuits 20 to 24 and 31 to 36 are connected via a bus 30. For the data of the power supply voltage Vdd (a ground voltage Vgnd may be further added), it may be acceptable to obtain the data of the actual circuit from the DUT 50 as described above or to obtain the data by performing a circuit simulation by using a circuit simulator based on a netlist of a semiconductor integrated circuit (data representing the connection state of the circuit).

In the first preferred embodiments a method for performing the analysis and designing of the operation timing by calculating the fluctuation of the delay time of the logic gates due to the high-frequency component in addition to the low-frequency component including DC regarding the power supply noise of the semiconductor integrated circuit is described below.

Figure 3B:
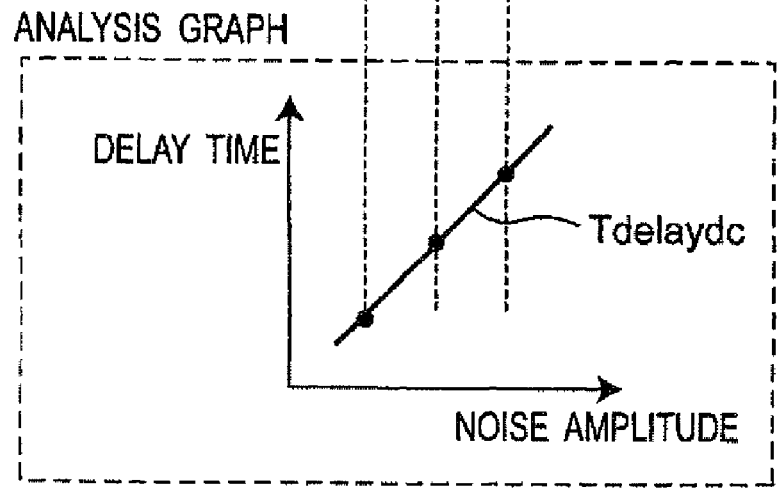
FIG. 3B is an analysis graph showing a delay time with respect to the noise amplitude according to a prior art.
Figure 4:
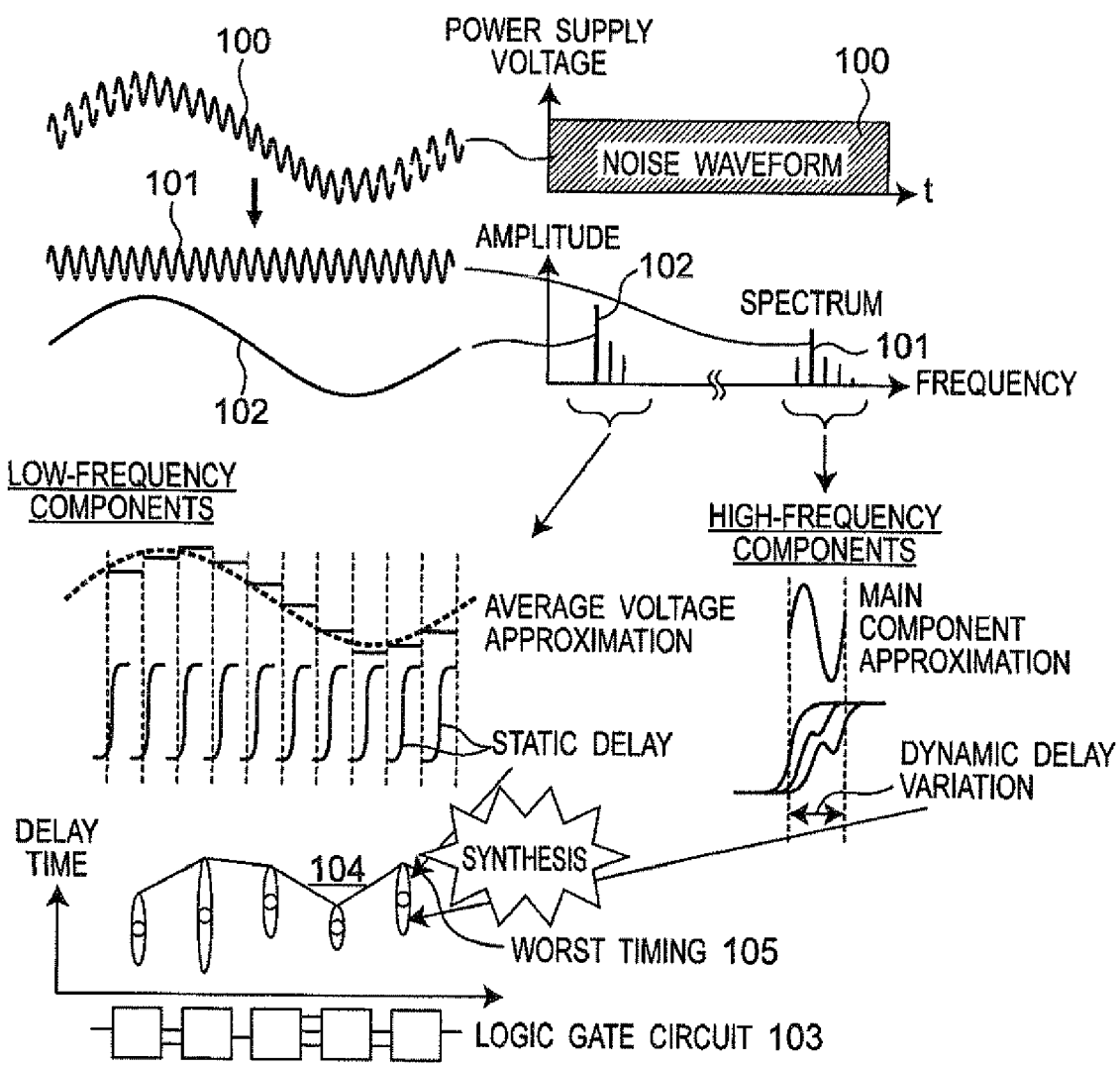
FIG. 4 is a view showing an example timing analysis method for the semiconductor integrated circuit according to the present preferred embodiment.

FIG. 2A is a waveform chart showing waveforms of a power supply voltage and a signal voltage when the noise amplitude of the semiconductor integrated circuit is small. FIG. 2B is a waveform chart showing waveforms of the power supply voltage and the signal voltage when the noise amplitude of the semiconductor integrated circuit is large. FIG. 2C is an analysis graph showing a delay time with respect to the noise amplitude according to the present performed embodiment. FIG. 3A is a waveform chart showing waveforms of the power supply voltage and the signal voltage of the semiconductor integrated circuit. FIG. 3B is an analysis graph showing a delay time with respect to the noise amplitude according to a prior art. Further, FIG. 4 is a view showing a timing analysis method for semiconductor integrated circuit according to the present preferred embodiment. According to the prior art, as shown in FIG. 3, the analysis of a delay time Tdelay of the noise amplitude is performed based on only a DC component Vdddc of the power supply voltage (See, for example, Patent Document 1). However, as shown in FIGS. 2 and 4, the present preferred embodiment is characterized in that the analysis of the delay time Tdelay of the noise amplitude is performed based on its AC components Vddac in consideration of its fluctuation Tdelayvar in addition to the DC component Vdddc of the power supply voltage. For example, as shown in FIG. 4, a power supply voltage 100 contains noises, which are decomposed into high-frequency components 101 (having frequencies (or equal to or) higher than a predetermined threshold frequency and low-frequency components 102 (having frequencies for equal to or) lower than the predetermined threshold frequency) by an FFT processing. In consideration of a worst timing 105 in a logic gate circuit 103 based on a static delay time based on the low-frequency component 102 and a dynamic delay time based on the high-frequency component 101, the operation timing of the output signal is analyzed by synthesis of them.

FIG. 6 is a flow chart showing a general outline of example calculation and processing of the delay time of the logic gates in the timing analysis in consideration of a dynamic power supply noise according to the present preferred embodiment.

Referring to FIG. 6, the processing of obtaining a power supply noise model is performed at step S1. In concrete, a power supply noise model is formed by using a power current model of a high waveform accuracy of the DUT 50 and a power system AC impedance model (this model means a model that represents an impedance of a power supply configured by including an inductance, a capacitance and a resistance which are inserted in series with the power source). A voltage waveform of the power supply noise (the voltage waveform may be at least one of the power supply voltage and the ground voltage of the power supply) is simulated (otherwise the actual voltage waveform may be detected) on this basis by a circuit simulator, and the data is obtained. Subsequently, an FFT (Fast Fourier Transformation) analysis processing is performed at step S2. In concrete, a spectral data is calculated by performing FFT operation for the voltage data of the power supply noise, and thereafter, the main components in the low-frequency region and the high-frequency region are extracted in consideration of a plurality of clock domains having different frequencies and phases. Then, the processing of the delay time fluctuation analysis is executed at step S3. In concrete, the static delay time is calculated from the low-frequency component, and a timing fluctuation width due to the high-frequency content is analyzed and calculated, Further, a timing analysis processing using a delay time margin is performed at step S4. In concrete, timing design is achieved through the timing analysis processing by absorbing a phase relation between the noise waveform and the transition into the duration of the delay time for adjustment such that the output timing of each logic gate falls within a predetermined time interval so that, for example, SDF (Standard Delay Format) used in the present technical field has a latitude. That is, a design such that optimal timing is achieved by reconstructing the digital circuit so that the calculated delay in the circuit falls within a predetermined value in the timing design using SDF.

FIG. 7 is a flow chart showing an example processing of calculation of the delay time of the logic gates in a digital circuit design in consideration of the dynamic power supply noise according to the present preferred embodiment.

Referring to FIG. 7, the processing includes the following steps.

(1) Step S11: a processing for obtaining a power supply noise model.
(2) Step S12: an FIT analysis processing.
(3) Step S13: a processing of the delay time fluctuation analysis. The processing includes processing by the DC component and processing by the AC components.
(4) Step S14: a calculation processing of the delay time.
(5) Step S15: a digital circuit design processing.

These processings are described in detail below with reference to FIGS. 8 to 14.

Figure 9:
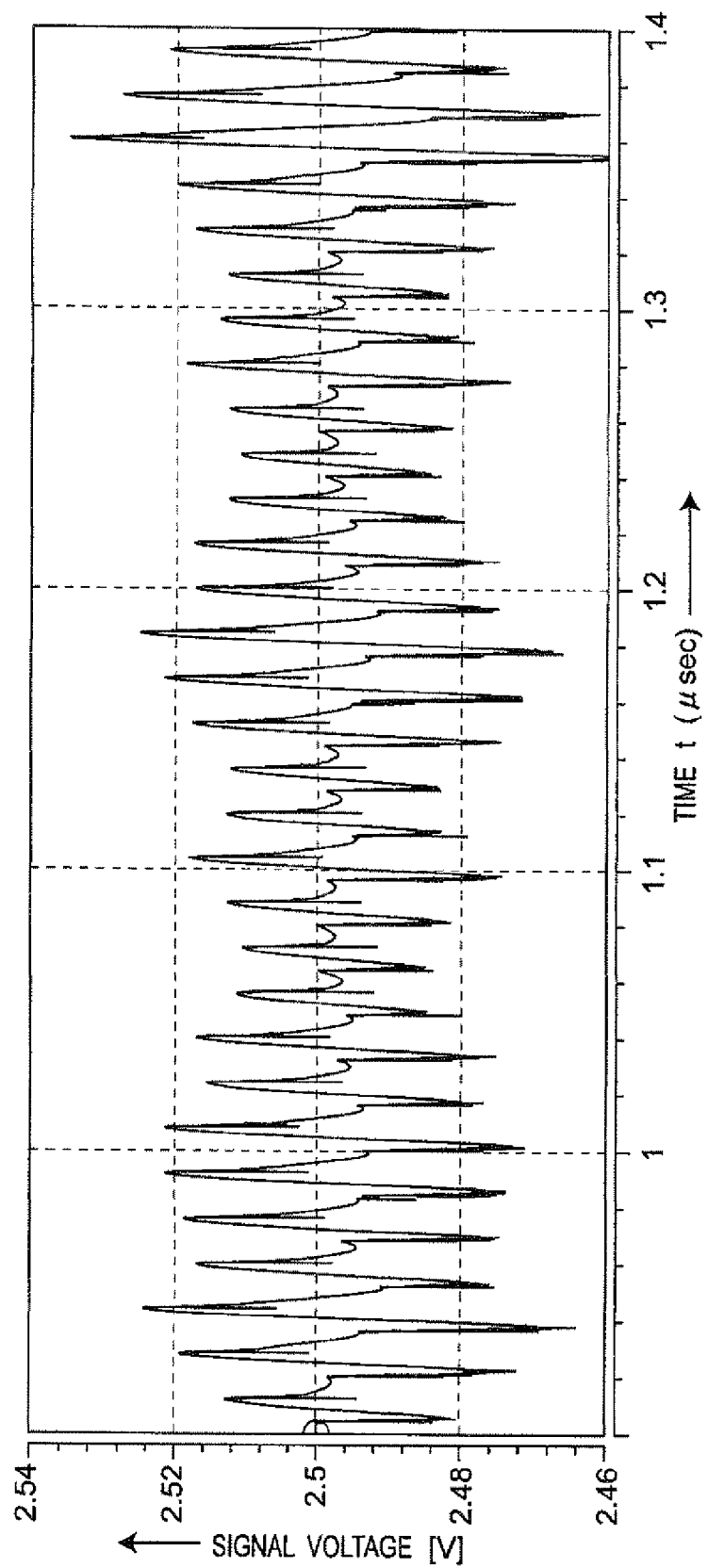
FIG. 9 is a waveform chart showing one example of the power supply noise.
Figure 10:
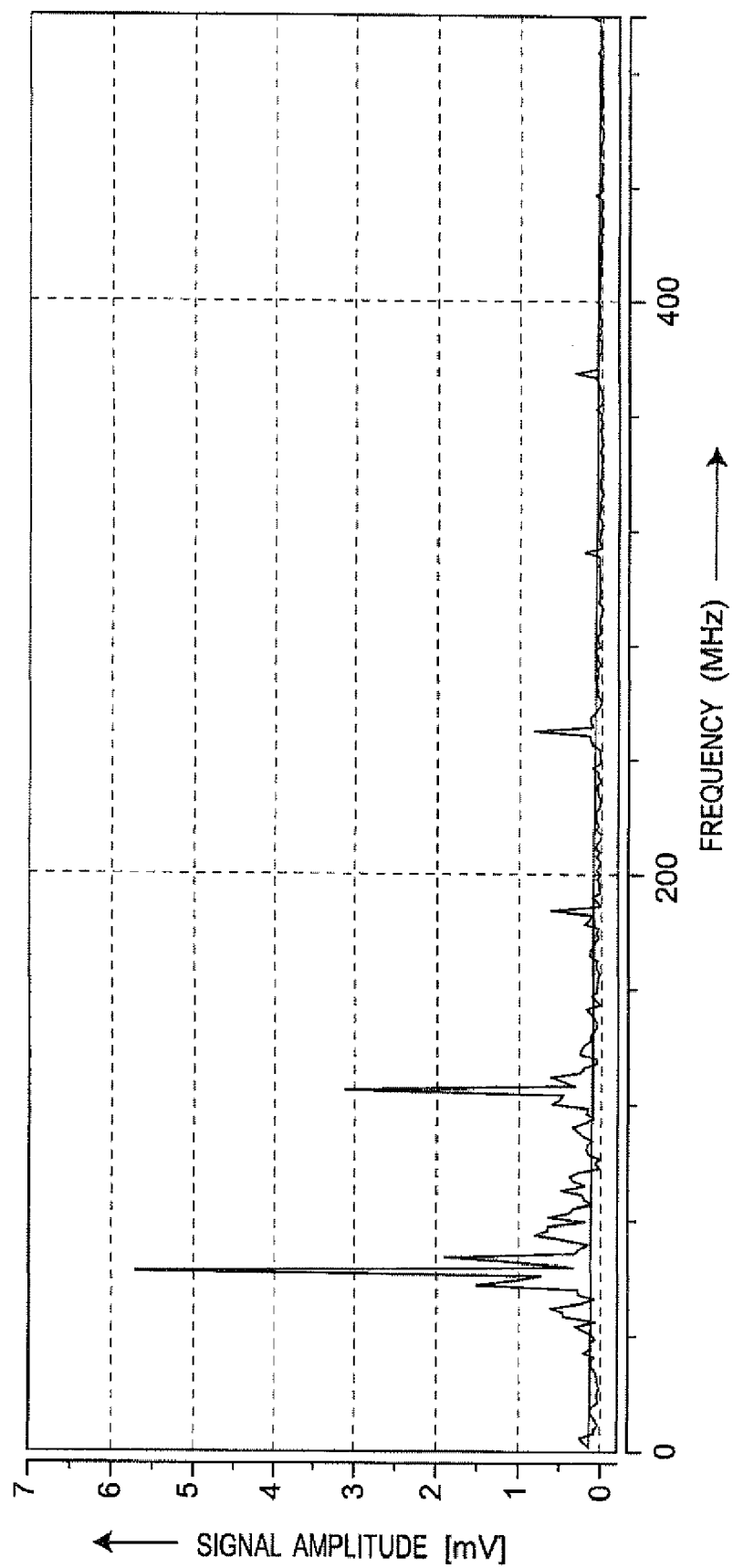
FIG. 10 is a spectral diagram when the example power supply noise of FIG. 9 is subjected to Fourier transformation.

First of all, at step S11, the power supply noise (and ground noise) of a digital LSI is simulated (or detected from the actual circuit) by using, for example, a power system AC impedance model, and its voltage noise waveform data is obtained. Subsequently, the FFT (Fast Fourier Transformation) analysis processing is performed at step S12. In concrete, spectral data is calculated by performing FFT operation for the voltage data of the power supply noise, and thereafter, the main components in the low-frequency region and the high-frequency region are extracted in consideration of a plurality of dock domains having different frequencies and phases. FIGS. 8A and 8B are views each showing an analysis processing of the power supply noise according to the present preferred embodiment. FIG. 8A shows the voltage waveform 100 of the power supply noise, and by performing FIT operation for the data, the low-frequency component 102 including DC and the high-frequency component 101 are obtained through spectral decomposition as shown in FIG. 8B. FIG. 9 is a waveform chart showing one example of the power supply noise, and FIG. 10 is a spectral diagram when the power supply noise in FIG. 9 is subjected to Fourier transformation. As is apparent from FIGS. 9 and 10, it can be understood that various peak components exist in the power supply noise.

Subsequently, the processing of the delay time fluctuation analysis is performed at step S13. In this case, the analysis processing of the static gate delay time due to the DC component of the power supply noise and the analysis processing of the fluctuation components of the gate delay time due to the AC components of the power supply noise are performed, and they are described below separately in detail.

Figures 11, 12:
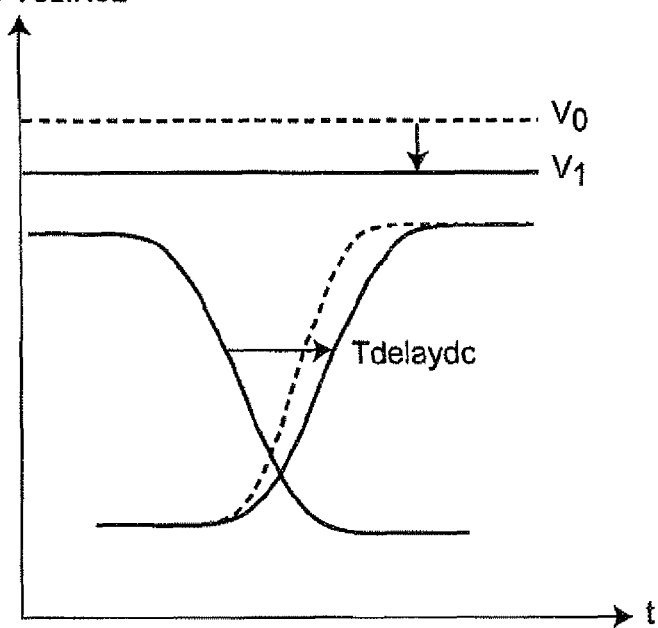
FIG. 11 is a table showing a static gate delay time to load conditions and the voltages of a DC component as one example of a table used for processing of the delay time fluctuation analysis (DC) according to the present preferred embodiment.
FIG. 12 is a waveform chart showing an example change in the gate delay time of the processing of the delay time fluctuation analysis (DC)

First of all, in the analysis processing of the static gate delay time due to the DC component of the power supply noise, the DC voltage value (Vdddc (Vgddc)) of the power supply (and preferably the ground) is calculated by averaging the voltage fluctuations within the switching operation time of the logic gates for the low-frequency noise component obtained at step S12, and the static delay time (Tdelaydc) of the logic gates at the voltage is calculated. In this case, a relation between Vdddc (Vgddc) and Tdelaydc is preparatorily characterized by the circuit simulation. In concrete, a table in which the delay time Tdelaydc is calculated by the circuit simulation is prepared for combinations of the conditions obtained by dispersing the DC voltage value, the kind of the logic gates, the transition duration of the input and the output load and added to a logic gate library (stored in the data memory 23). FIG. 11 is a table showing a static gate delay time to load conditions and the voltages of a DC component as one example of a table used for a processing of the delay time fluctuation analysis (DC) according to the present preferred embodiment. FIG. 12 is a waveform chart showing a change in the gate delay time of the processing of the delay time fluctuation analysis (DC). The DC component of the power supply noise can be assumed to be the effective power supply voltage applied to the logic gates. Therefore, the gate delay time is calculated by a circuit simulator on the conditions of the DC component voltage and the load conditions (output load impedance, slope of the input signal, etc.) and prepared for each logic gate in a form of table as shown in FIG. 11.

Referring to FIG. 11, the vertical axis represents the load conditions of the output load impedance, the slope of the input signal and so on, and the horizontal axis represents the voltage of the DC component. Each of the numerical values in the table is the delay time Tdelaydc (Fdc) corresponding to each item.

Subsequently, in the analysis processing of the static gate delay time due to the AC components of the power supply noise, attention is paid to the amount of fluctuation (Tdelayvar) of the delay time ascribed to the fact that the voltage fluctuation (Vddac (Vgdac)) of the power supply (and preferably the ground) due to the high-frequency noise component obtained at step S12 dynamically modulates the power current flowing through the logic gates within the switching operation time of the logic gates. In this case, for the high-frequency noise component of the power supply voltage (ground) and the switching operation of the logic gates, the fluctuation Tdelayvar of the delay time is changed by the relative position of both of them on the time base. In the present preferred embodiment, the power supply noise is represented by a high-frequency main component. That is, by substituting the noise with a sine waveform having a periodicity, the minimum value and the maximum value (and preferably the fluctuation width) (Tdelaymin, Tdelaymax (Tdelayvarwidth)) of the fluctuation Tdelayvar of the delay time are calculated. In this case, the relation between (Vddac (Vgdace) and Tdelyvar is preparatorily characterized by the circuit simulation. In concrete, a table in which the fluctuation Tdelayvar of the delay time is calculated by the circuit simulation is prepared for combinations of the conditions obtained by dispersing the noise frequency, the noise amplitude, the kind of the logic gates, the transition duration of the input, the output load, the power supply (ground) noise and the relative time of the output and added to the logic gate library (stored in the data memory 23). Moreover, when the main component of the power supply (ground) noise is expressed by a multiplicity of frequencies, Tdelayvar (Fac) with respect to each frequency Fac is calculated.

Figures 13, 14:
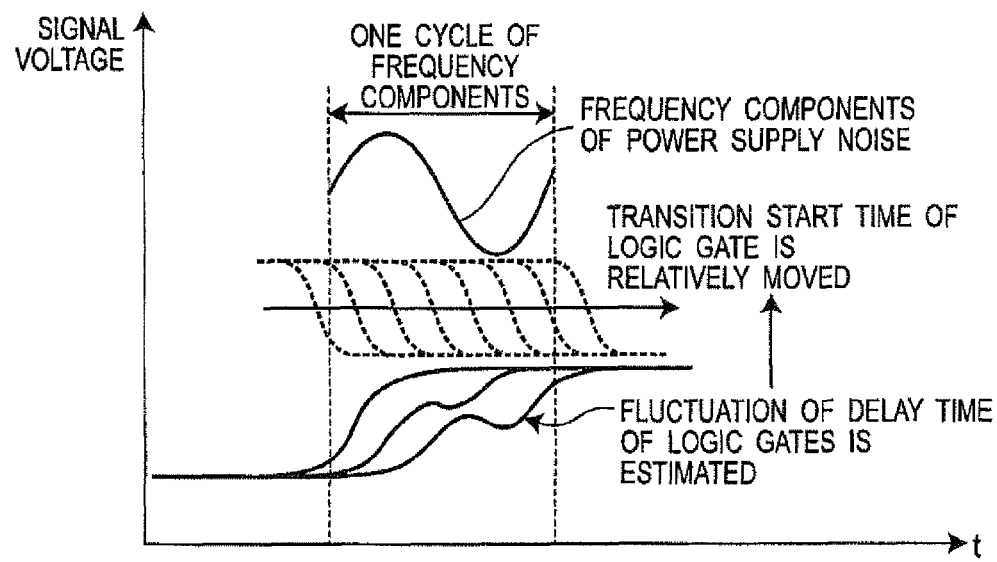
FIG. 13 is a table showing one example of a table (prepared for each frequency Fac) of fluctuation components of the delay time of the frequency components to a voltage Vac (Vpp) of a frequency component (Fac) of the power supply noise and the load conditions used for the processing of the delay time fluctuation analysis (AC) according to the present preferred embodiment.
FIG. 14 is a graph showing an example update processing of the delay time in digital circuit design processing according to the present preferred embodiment.

FIG. 13 is a view showing one example of a table (prepared for each frequency Fac) of fluctuation components of the delay time of the frequency components with respect to a voltage Vac (Vpp) of a frequency component (Fac) of the power supply noise and the load conditions used for the processing (AC) of the delay time fluctuation analysis (AC) according to the present preferred embodiment. In the processing, the dynamic component of the power supply noise is approximated by the AC power supply that cyclically fluctuates, and the delay time of the logic gates is analyzed under the power supply. At this time, the fluctuation of the delay time due to the phase difference between the AC power supply and the transition timing of the logic gates is estimated, and the maximum value Tdelaymax and the minimum value Tdelaymin are obtained. In this case, these values of the gate delay time are calculated every type of the logic gates by the circuit simulation for the AC voltage amplitude, the frequency and the load conditions (output load impedance, slope of the input signal, etc.) and so on and summarized into a table as shown in FIG. 13.

Referring to FIG. 13, the vertical axis represents the load conditions of the output load impedance, the slope of the input signal and so on, and the horizontal axis represents the voltage amplitude Vac (Vpp) at the frequency Fac of the AC components of the power supply noise.

Further, the calculation processing of the delay time is performed for each logic gate at step S14. In this processing, a static delay time Tdelaydc and a fluctuation width Tdelayvar of the dynamic delay time are synthesized for each logic gate in the digital LSI, and the operation timing of design is determined. When Tdelayvar(Fac) calculated for a plurality of frequency components is used, it is proper to consider that Tdelayvar is added to contain the entire Tdelayvar(Fac). In many cases, it is considered that Tdelayvar(Fac) of the other components is included within a variation range Tdelaywidth (Fac) of Tdelayvar(Fac) ascribed to the frequency component Fac of the largest intensity. In concrete, the following implemental example is proposed.

A gate delay time Tdelaymodified in consideration of the dynamic power supply noise is calculated by using the following Equation (1). It is noted that $F_1, F_2, F_3, \ldots$ represent frequencies of the high-frequency components larger than, for example, a predetermined threshold value amplitude (or threshold value power).

$$Tdelaymodified = a_0 Tdelaydc(Fdc) + a_1 Tdelaymax(F_1) + \quad (1)$$
$$a_2 Tdelaymax(F_2) + a_3 Tdelaymax(F_3) + \ldots.$$

The following four implemental examples are proposed as a method of using the above Equation (1).

(1) First implemental example: all coefficients $a_x$ (x=0, 1, \ldots, n) are assumed to be one.

(2) Second implemental example: only a coefficient $a_0$ and a coefficient $a_{xmax}$ relevant to a frequency $F_{xmax}$ that takes the maximum voltage amplitude are assumed to be one, and the other coefficients $a_x$ are assumed to be all zero.

(3) Third implemental example: only the coefficient $a_0$ and $a_{xCLK}$ relevant to $F_{xCLK}$ equal to the clock frequency are assumed to be one, and the other coefficients $a_x$ are assumed to be all zero.

(4) Fourth implemental example, only the coefficient $a_O$, $a_{xCLK}$ relevant to $F_{xCLK}$ equal to the clock frequency, and $a_{2xCLK}$ relevant to $F_{2xCLK}$ equal to two times (or possibly multiple times) the clock frequency are assumed to be one, and the other coefficients $a_x$ are assumed to be all zero.

(5) Fifth implemental example: each coefficient $a_x$ is assumed to be a real number weighed based on the actual measurement results, the simulation results, the voltage value, a model in consideration of the impedance of the package, the structure of the power wiring, the number of gates of the digital circuit, experiences and so on.

In other words, in the first implemental example, the delay time of each logic gate is obtained as high-frequency components in consideration of the influence of the delay time at the frequency of each high-frequency component larger than a predetermined threshold value amplitude (or threshold value power). Moreover, in the second implemental example, the delay time of each logic gate is obtained as high-frequency components in consideration of the influence of the delay time relevant to the frequency $F_{xmax}$ that takes the maximum voltage amplitude. Further, in the third implemental example, the delay time of each logic gate is obtained as high-frequency components in consideration of the influence of the delay time relevant to the clock frequency $F_{xCLK}$. Furthermore, the delay time of each logic gate is obtained as high-frequency components in consideration of the influence of the delay time relevant to the clock frequency $F_{xCLK}$ and the frequency $F_{2xCLK}$ that is two times the clock frequency $F_{xCLK}$.

Although the gate delay time is estimated by separation into the DC component and the high-frequency components of a plurality of frequencies in the above Equation (1), the present invention is not limited to this, and it may be allowed to take the low-frequency components (at least at one frequency) in the neighborhood of the DC component into consideration. In the above case, it can be considered that the threshold frequency for separating the power supply noise into the low-frequency components and the high-frequency components is set from the average value of the frequency distribution or following the dynamic change in the frequency distribution in the analysis processing of the frequency components of the power supply noise at step S12. That is, the noise waveform is subjected to FFT analysis in consideration of the operation items (clock frequency, operating voltage, changeover of operation mode, and changeover of kind of processing data, etc.) of the digital circuit to be analyzed, and the frequency division is changed at step S12. Further, more generally, a static DC drop component by averaging a leakage current of the digital LSI and the logic gate flowing current in the low-frequency region, and the clock frequency component and its higher harmonics (in particular, double) due to a clock signal supply system and a flip-flop in the high-frequency region are the main components of the noises in the respective frequency regions. These can be made representative values in the fluctuation calculation of the two components at step S13 as described above.

Figure 15:
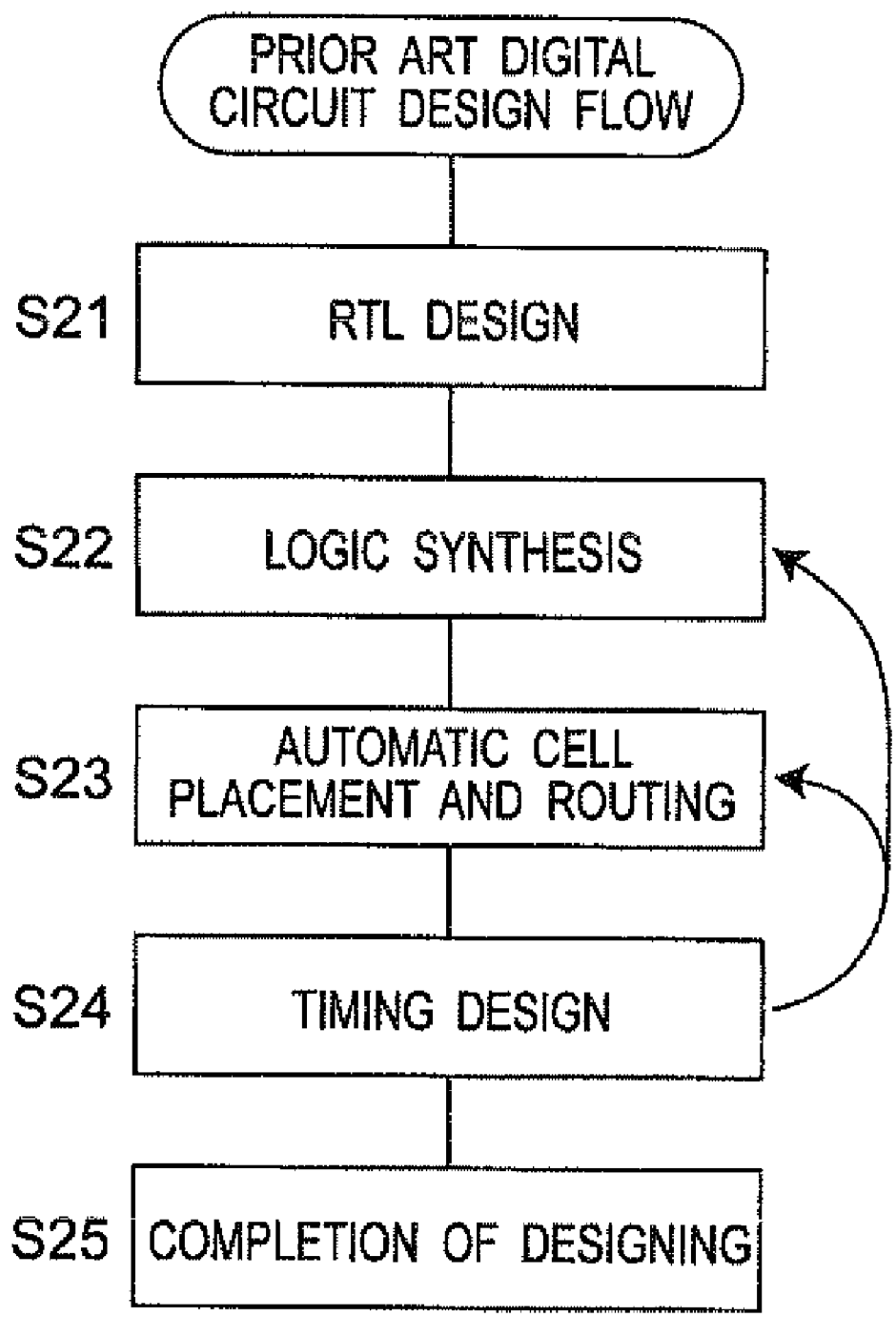
FIG. 15 is a flow chart showing a digital circuit design flow according to the prior art.

Further, a digital circuit design processing is performed at step S15. In concrete, the circuit design of FIG. 16 is performed. FIG. 15 is a flow chart showing a digital circuit design flow according to the prior art, and FIG. 16 is a flow chart showing a digital circuit design flow according to the present preferred embodiment. As shown in FIG. 15, an RTL (Register Transfer Level) design is performed at step S21, and a logical synthesis is performed at step S22. Automatic placement and route technique (P & R) is performed at step S23, and a timing design of each logic gate is performed at step S24 to complete the design. In the present preferred embodiment, the analysis (steps S11 to S13) of the power supply noise is performed as described in detail above at step S26 after the processing of step S23, and thereafter, calculation (step S14) of the gate delay time in consideration of the power supply noise is performed at step S27 to reflect it on the timing design of each logic gate at step S24. In concrete, the timing design is achieved through the timing analysis processing by absorbing a phase relation between the noise waveform and the transition into the duration of the delay time for adjustment such that the output timing of each logic gate falls within a predetermined time interval so that, for example, the SDF (Standard Delay Format) used in the present technical field has margins. That is, a design such that optimal timing is achieved by reconfiguring the digital circuit so that the calculated delay in the circuit falls within a predetermined value like the timing design using the SDF.

FIG. 14 is a graph showing an update processing of the delay time in a digital circuit design processing according to the present preferred embodiment. As shown in FIG. 14, by evaluating the fluctuation of the delay time of the logic gates and moving relatively the transition start time of the logic gates on the time basis, the operation timing can be adjusted so as to counterbalance the fluctuation of the delay time. The program flow returns to logical synthesis at step S22 or automatic placement and route technique (P & R) at step S23 for the digital circuit after the reflection of the delay time to redesign the digital circuit, and thereafter, the processing of steps S26 and S27 are performed to achieve optimal timing design at step S24 with updating the delay time.

As described above, according to the present preferred embodiment, the delay values of the logic gates that constitute the digital LSI can be calculated in consideration of the static and dynamic power supply noises. Further, the accuracy is increased by performing the calculation of the delay time in the semiconductor integrated circuit dividedly at each frequency by handling the action of the relative relation between the noise waveform and the logic gate operation on the time base as the fluctuation width of the delay time. Moreover, the calculating step of the delay time is largely simplified to execute these steps by the ability of the existent computer, and therefore, highly accurate timing design can be achieved in a short time.

Unique Advantageous Effects of Preferred Embodiments

In developing the recent System-on-Chip (SoC) digital LSI, large-scale integration in accordance with system function improvements, a power supply voltage reduction (lowering of voltage) and a power consumption reduction by the use of transistors shrunk in scale into sub-100 nm order are promoted. In particular, multi-power domain design to turn on/off the power supply every SoC function block and multi-clock domain design to selectively supply the clock signal are general for the purpose of reducing the power consumption. Further, in order to maintain the operating frequency at an optimum value, the power supply voltage or the clock frequency may sometimes be changed over every domain.

The timing design in the digital LSI design is complicated by the multi-domain orientation as described above, and the optimal timing design with a just enough timing margin is indispensable in order to improve the operating performance of the LSI with further reducing the power consumption.

Figure 5:
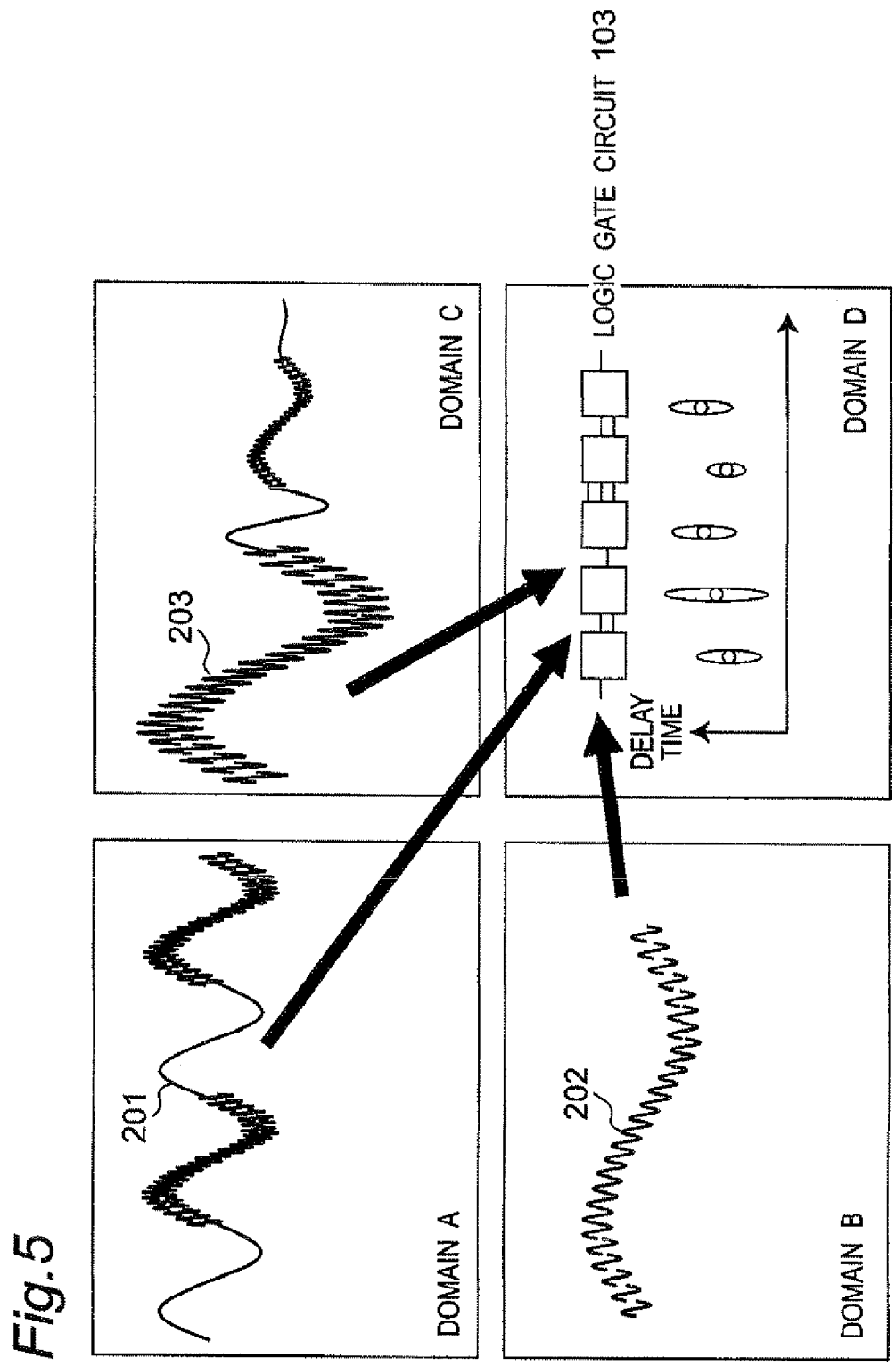
FIG. 5 is a view showing example influences exerted from each domain on a logic gate circuit 103 in the semiconductor integrated circuit.

In the timing design of the digital LSI by the preferred embodiment of the present invention, optimization of the timing design can be expected by taking the delay time fluctuations of the logic gates due to the static and dynamic power supply noises into consideration. Further, by handling the relative relation between the power supply noise waveform and the logic gate operation on the time base as the fluctuation width of the delay time, robustness of the timing design can be expected for the timing difference between the domains and its fluctuation (caused by clock jitter etc.) in the multi-domain design of SoC as described above (See FIG. 5).

First Implemental Example

Implemental examples of the frequency analysis of the power supply noise and the static and dynamic handling of a change in the delay time of the logic gates due to the power supply noise are described herein below.

As an example of the analysis results of the power supply and ground noise waveforms and the frequency components in the digital LSI, a simulation waveform of the power supply noise in the operation of a Z80 processor (transistor count: about 50 k pieces) and its FFT analysis results are shown in FIGS. 9 and 10, respectively. The simulation was obtained by simulating a power system impedance network and equivalent circuits extracted from a current waveform model ("power current waveform analysis method and analyzer of a semiconductor integrated circuit" (See Patent Document 1)) and the layout of a digital integrated circuit by a time series division parasitic capacitance column model by a circuit simulator. It is noted that a satisfactory coincidence with the actual measurement value of a 0.25-μm CMOS test chip has been confirmed for a substrate noise waveform analyzed by the same method for the same example, and the power supply noise waveform of FIG. 9 is reliable as the power supply noise waveform in the actual operation of the digital circuit. Although the present processor has a small scale, the internal activation and noises depend on a test vector. However, as apparent from the FFT operation results of FIG. 10, the main noise components are the operating clock frequency of 62.5 MHz and its higher harmonics, and the component of a significantly large intensity at the clock frequency can be represented as the component on the high-frequency side. On the other hand, the DC level is slightly dropped with respect to the reference power supply voltage of 2.5 V, and this can be handled as the numerical value on the low-frequency side.

The following method can be used for the acquisition technique and the frequency component analysis of the power supply noise waveform. For the acquisition of the power supply noise waveform, conventional techniques such as a transient analysis of the netlist of the whole digital LSI using a high-speed circuit simulator, a noise waveform analysis of the whole digital LSI by a dynamic noise analysis tool commercially available, or a macro-modeling technique for estimating the current waveform of the digital LSI (See Patent Document 1) can be used in addition to the method of obtaining the voltage noise waveform data by actually measuring the power supply voltage or the ground voltage of a semiconductor integrated circuit. Moreover, the frequency components of the power supply noise can be analyzed by applying the Fourier transformation method (FFT).

Second Implemental Example

The second implemental example is an application case for a CMOS standard cell library, and the results of calculating the gate delay time on the load state conditions by the circuit simulation is described below. The DC component of the power waveform on which a noise is superimposed can be regarded as an effective power supply voltage applied to the logic gates, and therefore, the gate delay time can be summarized into a table by calculating the gate delay time on the conditions of the effective power supply voltage and the load conditions by the circuit simulation. In this case, the table is prepared for each logic gate type.

Figure 17:
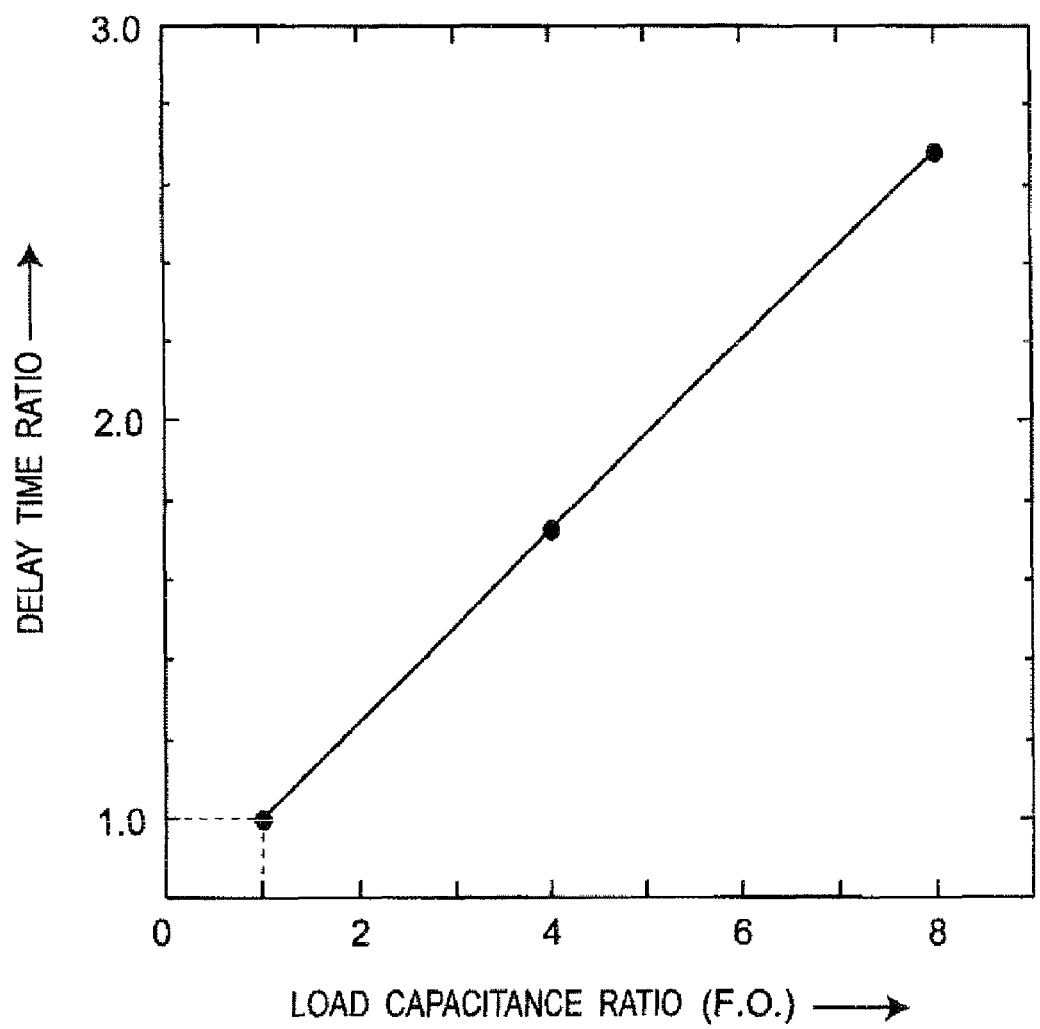
FIG. 17 is a graph showing a relation between a load capacitance ratio (F.O.) and a delay time ratio when the delay time on a reference load condition is assumed to be 1.0 in the processing of the delay time fluctuation analysis according to a second implemental example in a numerical case of the processing of the delay time fluctuation analysis at step S3 of FIG. 6 or step S13 of FIG. 7.

FIG. 17 is a graph showing a relation between a load capacitance ratio (Fan Out:F.O.) and a delay time ratio when the delay time on a reference load condition is assumed to be 1.0 in the processing of the delay time fluctuation analysis according to a second implemental example in a numerical case of the processing of the delay time fluctuation analysis at step S3 of FIG. 6 or step S13 of FIG. 7. In this case, the load capacitance ratio (F.O.) is a value obtained through measurement by standardizing the magnitude of the output load capacitance of the objective logic gate whose delay is to be estimated by the input capacitance of the logic gates in the subsequent stage, and the input capacitance of a "two-input NAND gate of a standard drive ability" is herein assumed to be F.O.=1. The state that F.O.=1 means a load state in which one gate is connected to a logic gate, and the state that F.O.=4 means a load state in which four gates are connected to a logic gate. The load capacitance ratio (F.O.) on the horizontal axis of FIG. 17 ranges from 0 to 9, and the data points are located at the points F.O.=1, 4, 8.

Figure 18:
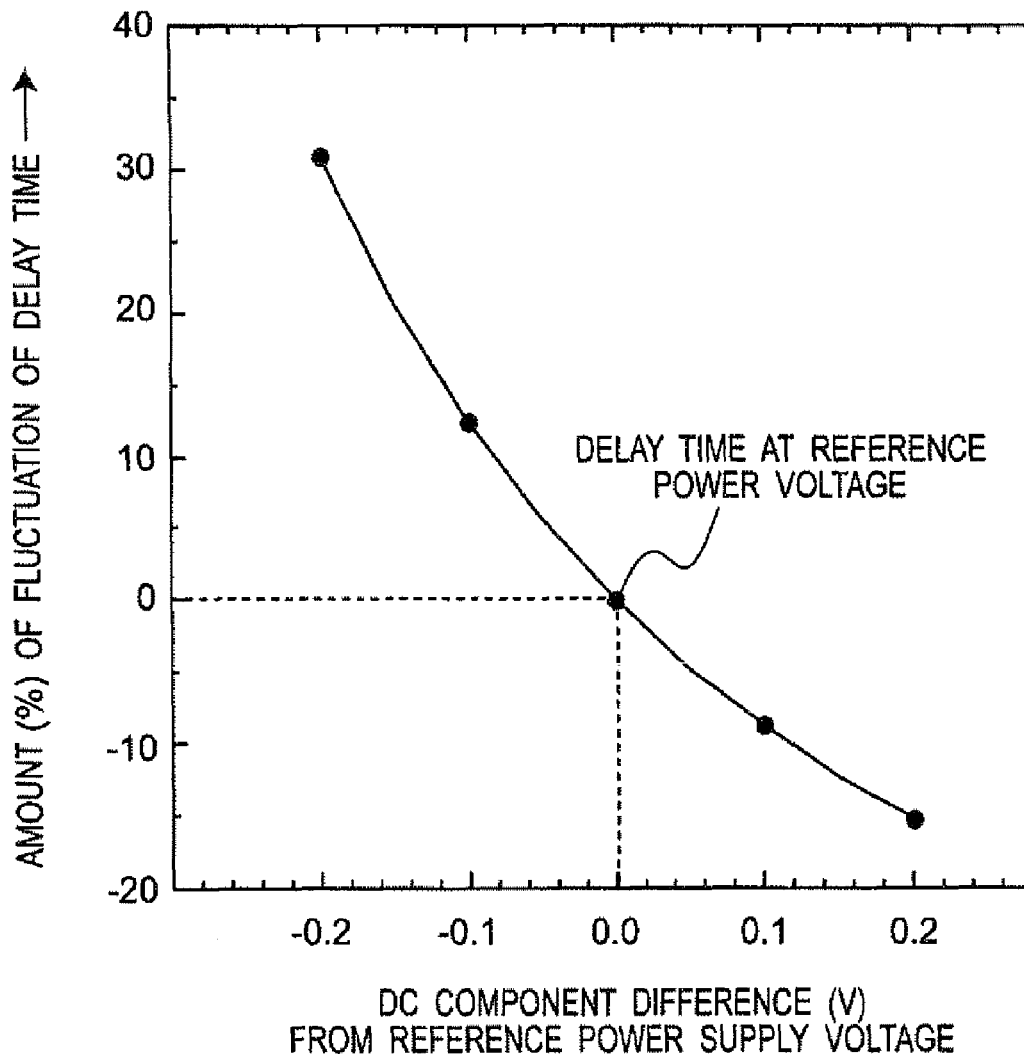
FIG. 18 is a graph showing an amount of fluctuation of the delay time with respect to a DC component difference (V) and a load capacitance ratio (F.O.) from a reference power supply voltage (e.g., nominal voltage of 1.0 V) in the processing of the delay time fluctuation analysis according to the second implemental example in a numerical case of the analysis processing of the delay time fluctuation analysis.
Figure 21:
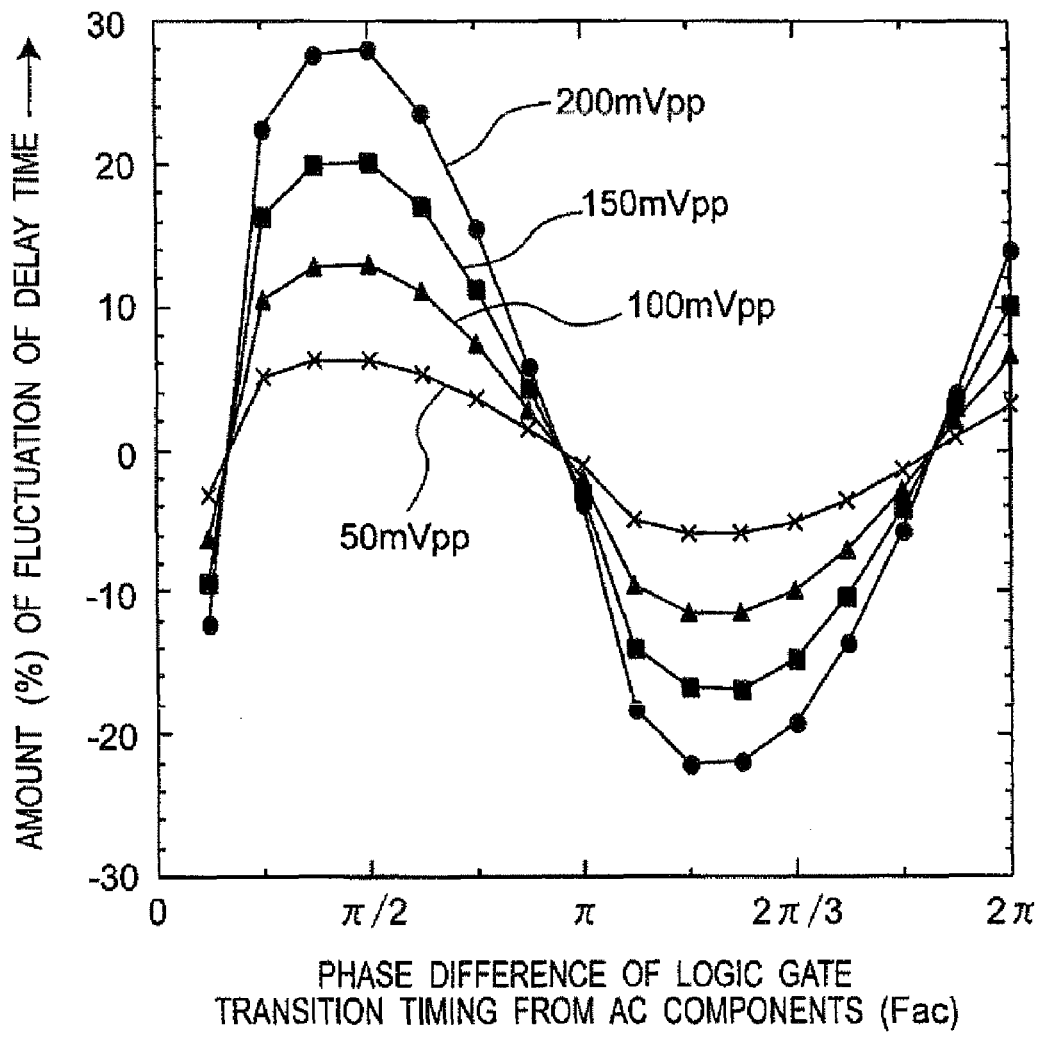
FIG. 21 is a graph showing one example of the amount of fluctuation (%) of the delay time with respect to the phase difference of the transition timing of the logic gates from the AC components (Fac) in the processing of the delay time fluctuation analysis according to the third implemental example in a numerical case of the processing of the delay time fluctuation analysis.

FIG. 18 is a graph showing an amount of fluctuation of the delay time with respect to a DC component difference (V) at a standard load capacitance ratio (F.O.=1) from a reference power supply voltage (e.g., a nominal voltage of 1.0 V) in the processing of the delay time fluctuation analysis according to the second implemental example in a numerical case of the analysis processing of the delay time fluctuation analysis. In the graph of FIG. 18, the amount of fluctuation of the gate delay time with respect to the amount of fluctuation of the DC voltage is calculated by the circuit simulation. In FIGS. 18 and 21, the power supply voltage is assumed to be the reference value (1.0 V), and the gate delay time (T0) when the load capacitance ratio F.O.=1.0 has a common value. If the amount of fluctuation (%) of the gate delay time is subjected to comparison, it can be understood that the delay time fluctuation due to the AC components (Fac) is larger than that of the DC component (Fdc).

FIG. 19 shows one example of a table that shows a numerical case of the processing of the delay time fluctuation analysis, and that shows the amount of correction of the delay time for fluctuation ratios Rvdc from the reference power supply voltage of the DC component and load capacitance ratios Rload (F.O.), in the processing of the delay time fluctuation analysis according to the second implemental example. FIG. 19 is a mathematical table showing a relation between the correction coefficient of the gate delay time and the fluctuation components of the DC voltage and is formed by calculating the amount of correction (%) (relative value of the amount of delay) with respect to the DC component (Fdc) of the power fluctuation by the circuit simulation by setting the gate delay time value when the reference power supply voltage value Vdc=1.0 of each load condition (i.e., fluctuation ratio Rvdc=0.0) is set to 0.0 (i.e., amount of correction Rcorrect=0.0). In the numerical example of FIG. 19, the fluctuation ratio Rvdc of each column represents a numerical value such that the DC component of the power waveform on which the power supply noise is superimposed is expressed as a fluctuation ratio from the reference power supply voltage, and the load capacitance ratio Rload (F.O.) of each row represents a load capacitance value such that the input load capacitance of the two-input NAND gate single unit is measured by setting Fan Out=1.0. Moreover, the amount of correction Rcorrect (%) of the gate delay value from a gate delay time (T0) in such a state that each load capacitance is connected at the reference power supply voltage is shown in each grid of the table. In this case, the gate delay time Tdelaydc after correction is expressed by the following Equation (2):

$$T\text{delay}dc = T0 \times (1.0 + R\text{correct}) \quad (2).$$

Third Implemental Example

In the third implemental example, a processing example of the processing of the delay time fluctuation analysis with paying attention to the AC components is described below. FIG. 20 is a table showing one example of a table that shows delay time fluctuation components to the load conditions of an output load impedance, the slope of an input signal and so on and an AC component voltage Vac (Vpp) at each AC component frequency Fac (MHz) in the processing of the delay time fluctuation analysis according to a third implemental example in a numerical case of the processing of the delay time fluctuation analysis. In this case, Vpp represents a voltage value measured peak to peak.

In the third implemental example, the dynamic component of the power supply noise is approximated by an AC power that cyclically fluctuates, and the delay time of the logic gates under the power is analyzed. In this case, the fluctuation of the delay time due to a phase difference in the transition timing between the AC power and the logic gates is estimated, and the maximum value Tdelaymax and the minimum value Tdelaymin thereof are obtained. In this case, these values of the gate delay time with respect to an AC component voltage Vac (Vpp) and the load conditions are calculated by the circuit simulation and summarized into a table at each frequency Fac. Moreover, the table is prepared for each logic gate type.

FIG. 21 is a graph showing one example of the amount of fluctuation (%) of the delay time with respect to the phase difference of the transition timing of the logic gates from the AC components (Fac) in the processing of the delay time fluctuation analysis according to the third implemental example in a numerical case of the processing of the delay time fluctuation analysis. In this case, the phase difference of the transition timing of the logic gates from the AC components (Fac) represents the timing when the transition of the logic gates is generated with respect to the AC components at a certain frequency (200 MHz in this case) as shown in FIG. 14. A relative positional relation was expressed as a phase value with respect to one cycle of a sine wave. In this case, measurement is performed horizontally in the direction of arrow in FIG. 14.

In the graph of FIG. 21, the amount of fluctuation of the gate delay time with respect to the phase difference between the dynamic component of the power supply noise and the logic gate operation is calculated by the circuit simulation when Fac=200 MHz. In this case, the delay time fluctuation due to the AC components (Fac) is larger than that of the DC component (Fdc). Therefore, it can be said that the conventional method of handling in a DC manner hardly produces a sufficient accuracy, and the handling of the dynamic noise by the proposed method is effective. Although the amount of fluctuation of the delay time is shown in FIGS. 19 and 21, the present invention is not limited to this, and it may be allowed to have an expression by the absolute value of the amount of delay.

FIG. 22 is a chart showing one example of a table that shows the amount of correction of the delay time relative to the reference power supply voltage, with the ratios Rvac (%) of the AC component amplitude and the load capacitance ratio Rload (F.O.) in the numerical case of FIG. 20. The table of FIG. 22 is one example of the table in which the amount of fluctuation of the gate delay time is expressed with respect to the dynamic component of the power supply noise and the load conditions. That is, it is an example in which the amount of correction (%) of the gate delay time with respect to the AC component voltage Vac (Vpp) of the power fluctuation is entered by setting the gate delay time value when each load condition reference power supply voltage value Vdc=1.0 (i.e., fluctuation ratio Rvdc=Rvac=0.0) is set to 1.0. In FIG. 22, for the numerical values in two tiers on each changed condition, the numerical value in the upper tier represents the amount of correction by which the delay value is minimized, and the numerical value in the lower tier represents the amount of correction by which the delay value is maximized. When the power fluctuation has an AC component, such a fluctuation width of the delay time exists. The numerical value is derived by the circuit simulation, and each table is formed for each AC frequency Fac (MHz). In the table, the fluctuation ratio Rvac in each column represents a numerical value such that the peak-to-peak amplitude of the AC components of the power waveform on which the power supply noise is superimposed is expressed as a fluctuation ratio with respect to the reference power supply voltage, and the load capacitance ratio Rload (F.O.) in each row represents a load capacitance value measured by setting the input load capacitance of the two-input NAND gate single unit at Fan Out=1.0. Moreover, the amount of correction Rcorrect (%) of the gate delay value from the gate delay time (T0) in such a state that each load capacitance is connected at the reference power supply voltage value in each grid of the table. In this case, the numerical value in the upper tier represents the amount of correction by which the gate delay value is minimized, and the numerical value in the lower tier represents the amount of correction by which the gate delay value is maximized. The gate delay time Tdelayvar{min, max} after correction is expressed by the following Equation (3):

$$Tdelayvar\{min, max\} = T0 \times (1.0 + Rcorrect\{upper\ tier,\ lower\ tier\}). \quad (3)$$

Although the amount of fluctuation of the delay time is shown in FIG. 22, the present invention is not limited to this, and it may be allowed to have an expression by the absolute value of the amount of delay.

Fourth Implemental Example

In the fourth implemental examples an example of design of the actual gate delay is described below by using Equation (1). In a case where a gate G2 that receives the output signal of a gate G1 as an input is connected, a gate delay time Tdelaymodified in consideration of the dynamic power supply noise at the gate G1 is expressed by using Equation (1). When the input load state of the gate G2 is a load capacitance ratio (F.O.)=4.0 and the power supply voltage applied to the gate G1 is lowered by 0.1 V due to the DC component (Fdc) of the power supply noise, the delay time Tdelaydc(Fdc) due to the DC component (Fdc) of the power supply noise can be obtained from FIG. 19 as +12.5% expressed by the amount of correction. Moreover, if an amplitude noise of 0.1 Vpp is generated by the AC components (Fac=200 MHz) of the power supply noise at the gate G1, then the maximum delay time Tdelaymax (200 MHz) and the minimum delay time Tdelaymin (200 MHz) due to the AC components of the power supply noise are obtained as 12.7% and −10.7%, respectively, expressed by the amount of correction. When the values of the maximum delay time Tdelaymax and the minimum delay time Tdelaymin are calculated on the assumption that all the coefficients $a_x$ (x=0, 1, ..., n) as one in Equation (1), the gate delay time Tdelaymodified in consideration of the dynamic power supply noise is expressed by the following Equation (4):

$$Tdelaymodified = Tdelaydc(Fdc) + Tdelaymax(200\ \text{MHz}) \quad (4)$$
$$= T0 \times (1.0 + 0.125 + 0.127)$$
$$= 1.252 \times T0.$$

That is, assuming that the delay time T0=1.0 nanosecond in the reference power supply voltage, a delay compensation of +252 picoseconds is obtained. Otherwise, by substituting not Tdelaymax (200 MHz) but Tdelaymin (200 MHz) into Equation (4), the following Equation (5) is obtained:

$$Tdelaymodified = Tdelaydc(Fdc) + Tdelaymin(200\ \text{MHz}) \quad (5)$$
$$= T0 \times (1.0 + 0.125 + 0.107)$$
$$= 1.018 \times T0.$$

For example, assuming that the delay time T0=1.0 nanosecond in the reference power supply voltage, a delay compensation of +18 picoseconds is obtained. If it is considered that the delay time has a latitude due to the AC components in the periphery of the delay due to the DC component of the power supply noise as described above, then it is considered that the gate delay time Tdelaymodified in consideration of the dynamic power supply noise at the gate G1 needs to estimate the maximum of 0.252 as a correction coefficient with respect to the delay time under the reference power supply voltage free of noise. By forming SDF from the thus-obtained delay time of each gate and reconstructing the digital circuit by timing design, optimal timing design can be achieved.

INDUSTRIAL APPLICABILITY

As described above, according to the timing analysis apparatus for use in semiconductor integrated circuit and method of the present invention, the delay values of the logic gates that constitute a semiconductor integrated circuit such as a digital LSI can be calculated in consideration of the static and dynamic power supply noises. Furthermore, by handling the action of the relative relation between the noise waveform and the logic gate operation on the time base or temporal axis as the fluctuation width of the delay time and performing calculation of the delay time in the semiconductor integrated circuit dividedly at each frequency, the accuracy is increased. Moreover, the calculation step of the delay time is largely simplified to execute these steps by the ability of the existent computer, and therefore, highly accurate timing design can be achieved in a short time.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A timing analysis apparatus arranged to analyze an operation timing of a semiconductor integrated circuit having a logic gate circuit including a plurality of logic gates, the analysis apparatus comprising:
   a controller arranged to
      obtain a noisewave form of a power supply noise of the semiconductor integrated circuit, the noisewave form being at least one of a power supply voltage and a ground voltage of a power supply for the semiconductor integrated circuit,
      decomposing decompose the noise waveform to obtain one or more frequency components of the noise waveform, classify the frequency components into low-frequency components having frequencies lower than a predetermined threshold frequency and high-frequency components having frequencies higher than the threshold frequency, calculate a static delay time of each of the logic gates due to the low-frequency components, calculate a dynamic delay time of each of the logic gates due to the high-frequency components, and determine a delay time of each of the logic gates by synthesizing the calculated static and dynamic delay times.

2. The timing analysis apparatus as claimed in claim 1, wherein the controller is further arranged to perform circuit design of the semiconductor integrated circuit by adjusting an output timing of each of the logic gates so as to fall within a predetermined time interval based on the determined delay time of each of the logic gates.

3. The timing analysis apparatus as claimed in claim 1, wherein the controller is arranged to preparatorily form a first table representing relations between load conditions and voltages of the low-frequency components for a delay time due to the low-frequency components in the semiconductor integrated circuit, store the table into a first storage device, and calculate the static delay time with reference to the first table.

4. The timing analysis apparatus as claimed in claim 1, wherein the controller is arranged to preparatorily form a second table representing relations among load conditions, voltage amplitudes of the high-frequency components and a frequency of the power supply voltage for fluctuation components of delay time due to the high-frequency components in the semiconductor integrated circuit, stores the table into a second storage device, and calculate the dynamic delay time with reference to the second table.

5. The timing analysis apparatus as claimed in claim 1, wherein the controller is arranged to calculate the dynamic delay time of each of the logic gates due to a high-frequency component that has a maximum voltage amplitude among the high-frequency components.

6. The timing analysis apparatus as claimed in claim 1, wherein the controller is arranged to calculate the dynamic delay time of each of the logic gates due to a high-frequency component that has a clock frequency of the semiconductor integrated circuit among the high-frequency components.

7. The timing analysis apparatus as claimed in claim 1, wherein the controller is arranged to calculate the dynamic delay time of each of the logic gates due to a high-frequency component that has a clock frequency of the semiconductor integrated circuit and a double frequency of the clock frequency among the high-frequency components.

8. The timing analysis apparatus as claimed in claim 1, wherein the controller is arranged to obtain the noise waveform through an actual measurement of the semiconductor integrated circuit.

9. The timing analysis apparatus as claimed in claim 1, wherein the controller is arranged to obtain the noise waveform through performing a circuit simulation of the semiconductor integrated circuit.

10. A timing analysis method performed by a timing analysis apparatus for analyzing an operation timing of a semiconductor integrated circuit having a logic gate circuit including a plurality of logic gates, the method including:

obtaining a noisewave form of a power supply noise of the semiconductor integrated circuit, the noisewave form being at least one of a power supply voltage and a ground voltage of a power supply for the semiconductor integrated circuit;

decomposing the noise waveform to obtain one or more frequency components of the noise waveform;

classifying the frequency components into low-frequency components having frequencies lower than a predetermined threshold frequency and high-frequency components having frequencies higher than the threshold frequency;

calculating a static delay time of each of the logic gates due to the low-frequency components;

calculating a dynamic delay time of each of the logic gates due to the high-frequency components; and determining a delay time of each of the logic gates by synthesizing the calculated static and dynamic delay times.

11. The timing analysis method as claimed in claim 10, further comprising performing a circuit design of the semiconductor integrated circuit by adjusting an output timing of each of the logic gates so as to fall within a predetermined time interval based on the determined delay time of each of the logic gates.

12. The timing analysis method as claimed in claim 10, further comprising:

preparatorily forming a first table representing relations between load conditions and voltages of the low-frequency components for a delay time due to the low-frequency components in the semiconductor integrated circuit;

storing the table into a first storage device; and calculating the static delay time with reference to the first table.

13. The timing analysis method as claimed in claim 10, further comprising:

preparatorily forming a second table representing relations among load conditions, voltage amplitudes of the high-frequency components and a frequency of the power supply voltage for fluctuation components of delay time due to the high-frequency components in the semiconductor integrated circuit;

storing the table into a second storage device; and calculating the dynamic delay time with reference to the second table.

14. The timing analysis method as claimed in claim 10, wherein the step of calculating the dynamic delay time of each of the logic gates comprises calculating the dynamic delay time of each of the logic gates due to a high-frequency component that has a maximum voltage amplitude among the high-frequency components.

15. The timing analysis method as claimed in claim 10, wherein the step of calculating the dynamic delay time of each of the logic gates comprises calculating the dynamic delay time of each of the logic gates due to a high-frequency component that has a clock frequency of the semiconductor integrated circuit among the high-frequency components.

16. The timing analysis method as claimed in claim 10, wherein the step of calculating the dynamic delay time of each of the logic gates comprises calculating the dynamic delay time of each of the logic gates due to a high-frequency component that has a clock frequency of the semiconductor integrated circuit and a double frequency of the clock frequency among the high-frequency components.

17. The timing analysis method as claimed in claim 10, wherein the step of obtaining the noise waveform comprises obtaining the noise waveform through an actual measurement of the semiconductor integrated circuit.

18. The timing analysis method as claimed in claim 10, wherein the step of obtaining the noise waveform comprises obtaining the noise waveform through performing a circuit simulation of the semiconductor integrated circuit.

* * * * *